(12) United States Patent
Xu et al.

(10) Patent No.: US 9,373,784 B2
(45) Date of Patent: Jun. 21, 2016

(54) SEMICONDUCTOR MEMORY DEVICE AND MANUFACTURING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Jia Xu, Shanghai (CN); GuanPing Wu, Shanghai (CN); Chao Zhang, Shanghai (CN); Daisy Liu, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 14/669,776

(22) Filed: Mar. 26, 2015

(65) Prior Publication Data
US 2015/0200359 A1 Jul. 16, 2015

Related U.S. Application Data

(62) Division of application No. 13/675,975, filed on Nov. 13, 2012, now Pat. No. 9,023,710.

(51) Int. Cl.
*H01L 45/00* (2006.01)

(52) U.S. Cl.
CPC .............. *H01L 45/06* (2013.01); *H01L 45/122* (2013.01); *H01L 45/1226* (2013.01); *H01L 45/1233* (2013.01); *H01L 45/1253* (2013.01); *H01L 45/1273* (2013.01); *H01L 45/144* (2013.01); *H01L 45/1666* (2013.01); *H01L 45/1683* (2013.01)

(58) Field of Classification Search
CPC .............. H01L 45/122; H01L 45/1226; H01L 45/1273
See application file for complete search history.

(56) References Cited

U.S. PATENT DOCUMENTS

| | | | |
|---|---|---|---|
| 2004/0126925 A1* | 7/2004 | Rodgers | H01L 21/76805 438/95 |
| 2007/0099405 A1 | 5/2007 | Oliva et al. | |
| 2007/0148855 A1 | 6/2007 | Chen et al. | |
| 2009/0014885 A1 | 1/2009 | Chen et al. | |
| 2009/0045388 A1 | 2/2009 | Clevenger et al. | |
| 2009/0189142 A1 | 7/2009 | Chen | |
| 2010/0006814 A1* | 1/2010 | Chen | H01L 45/06 257/4 |

FOREIGN PATENT DOCUMENTS

| | | |
|---|---|---|
| CN | 101286546 A | 10/2008 |
| CN | 101290968 A | 10/2008 |

* cited by examiner

*Primary Examiner* — Caleb Henry
*Assistant Examiner* — Mounir Amer
(74) *Attorney, Agent, or Firm* — Innovation Counsel LLP

(57) ABSTRACT

A semiconductor memory device includes a first insulating portion. The semiconductor memory device further includes a phase-change material element that contacts the first insulating portion. The semiconductor memory device further includes an electrode that contacts a side surface of the phase-change material element, the side surface of the phase-change material element being not parallel to a top surface of the electrode. The semiconductor memory device further includes a second insulating portion surrounding the phase-change material element.

20 Claims, 19 Drawing Sheets

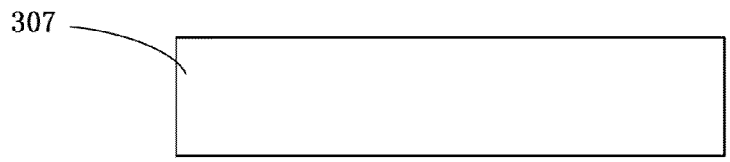
Fig. 7
Fig. 8(a)
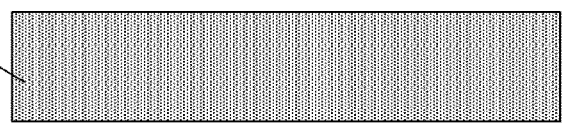
Fig. 8(b)
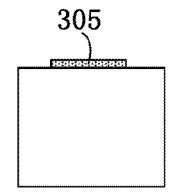
Fig. 9(a)　　　　　　　Fig. 9(b)
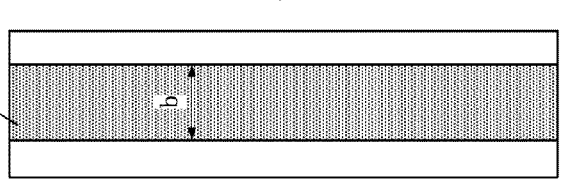
Fig. 9(c)

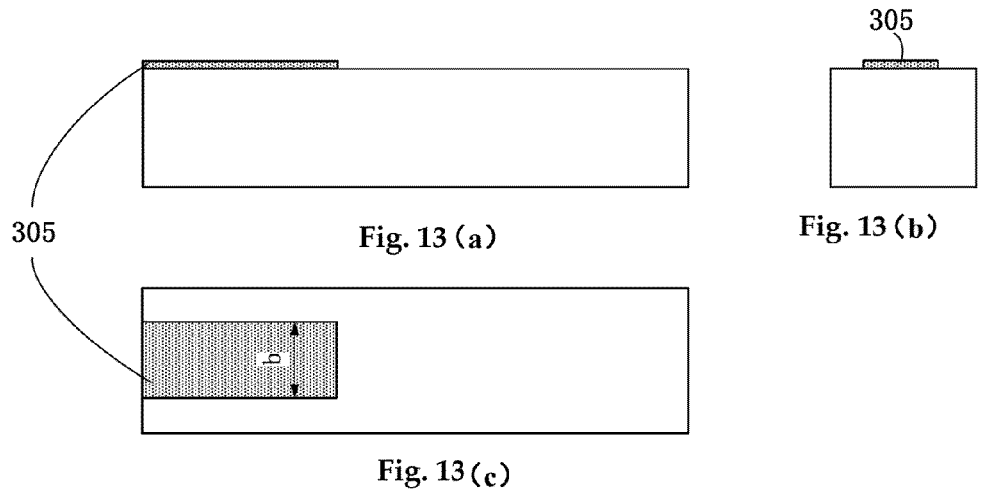
Fig. 13(a)  Fig. 13(b)
Fig. 13(c)
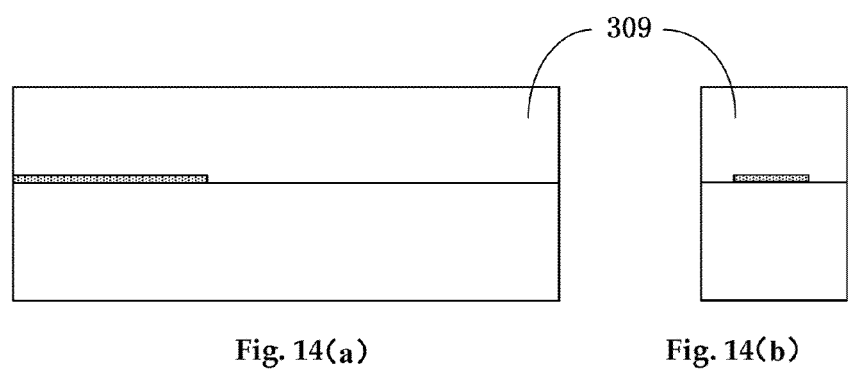
Fig. 14(a)  Fig. 14(b)
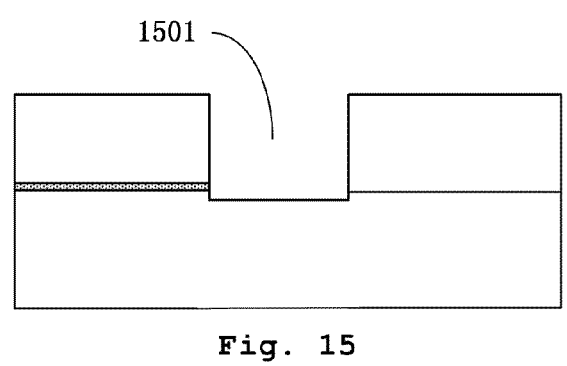
Fig. 15

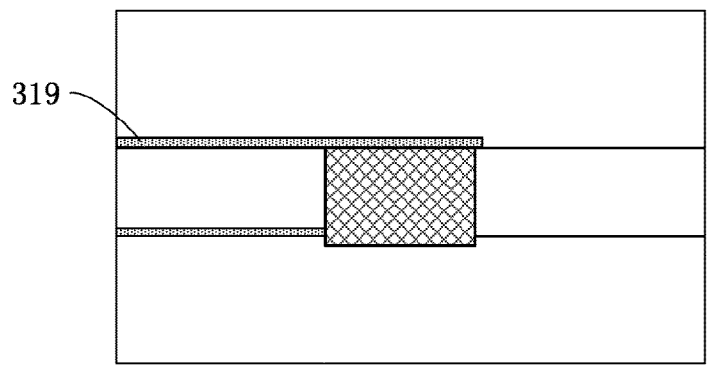
Fig. 19
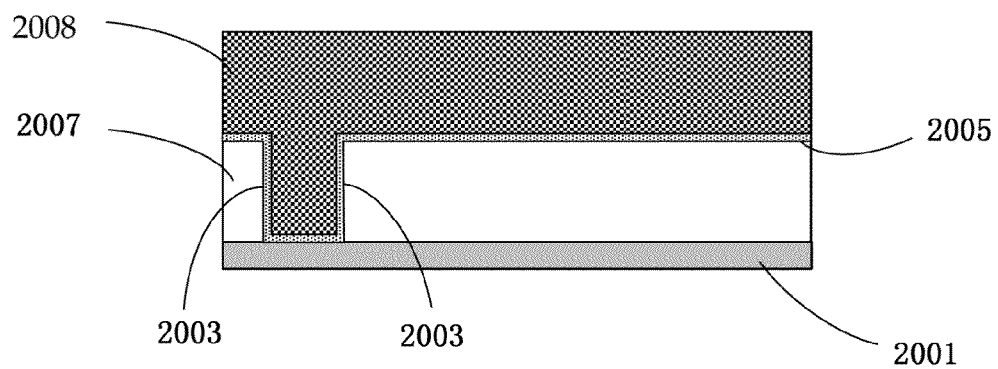
Fig. 20
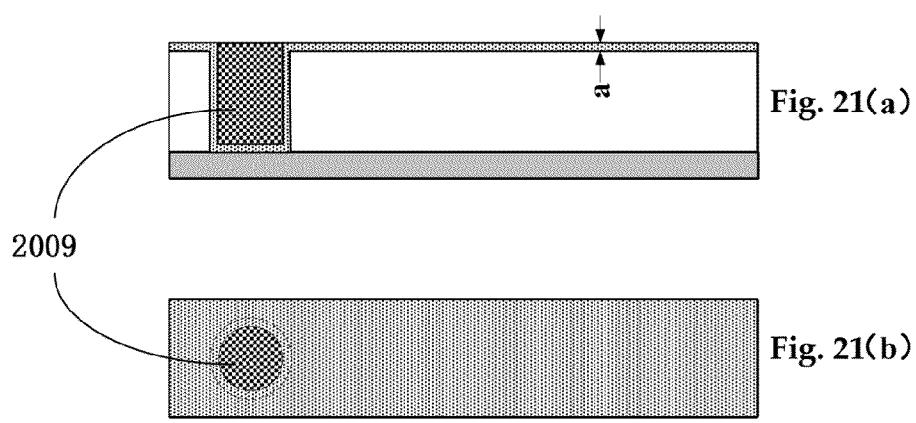
Fig. 21(a)
Fig. 21(b)

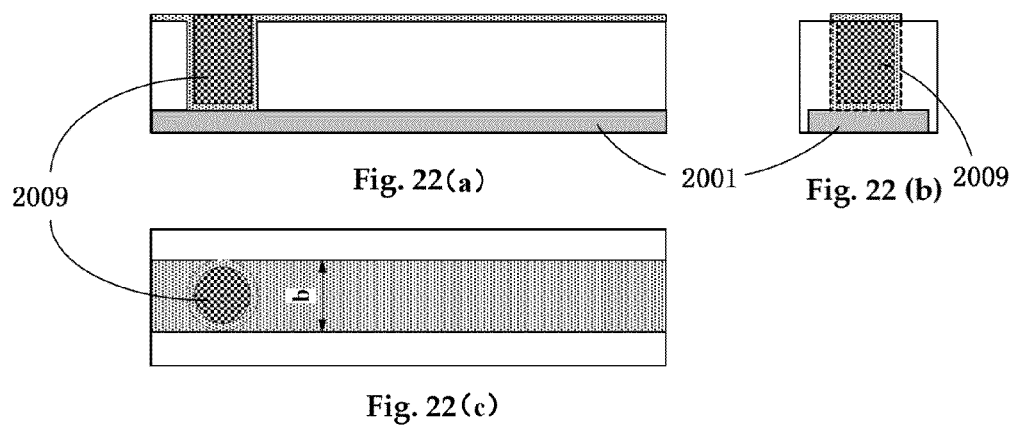
Fig. 22(a)  Fig. 22(b)
Fig. 22(c)
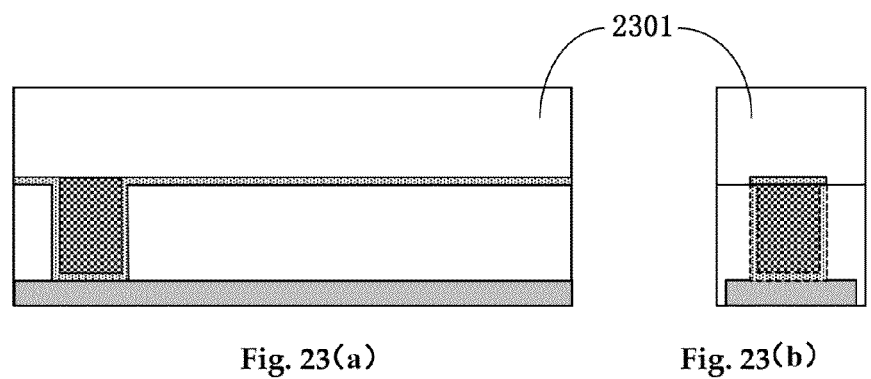
Fig. 23(a)  Fig. 23(b)
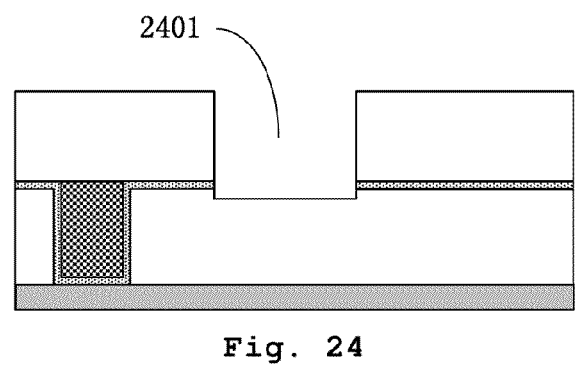
Fig. 24

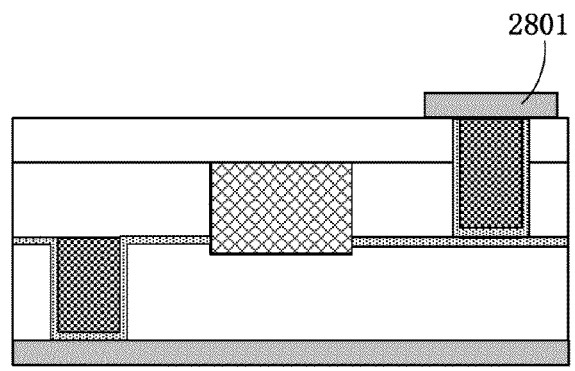
Fig. 28
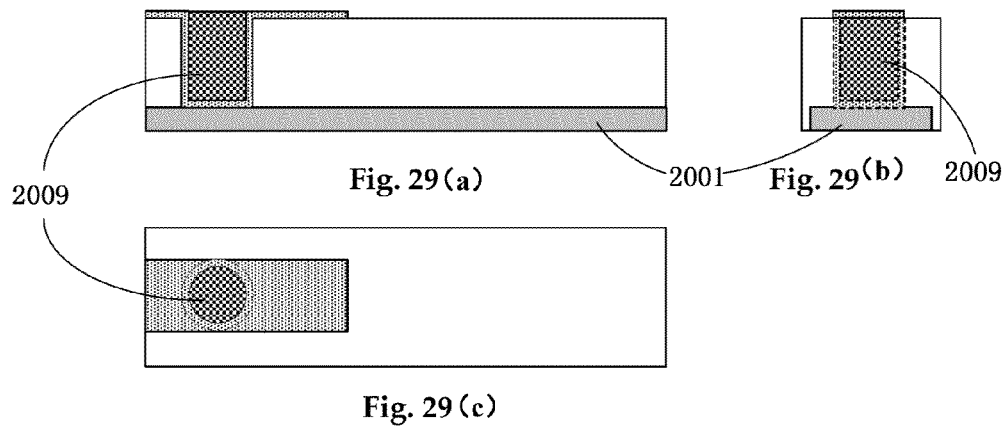
Fig. 29(a)    Fig. 29(b)
Fig. 29(c)
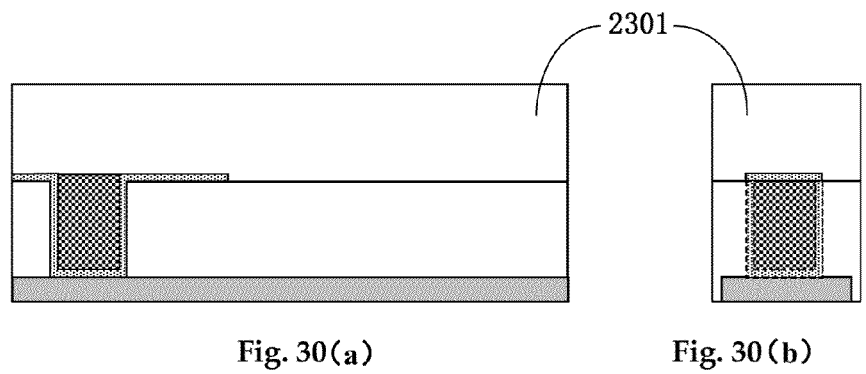
Fig. 30(a)    Fig. 30(b)

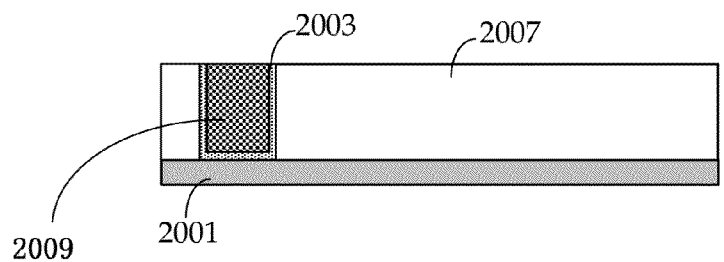
Fig. 37
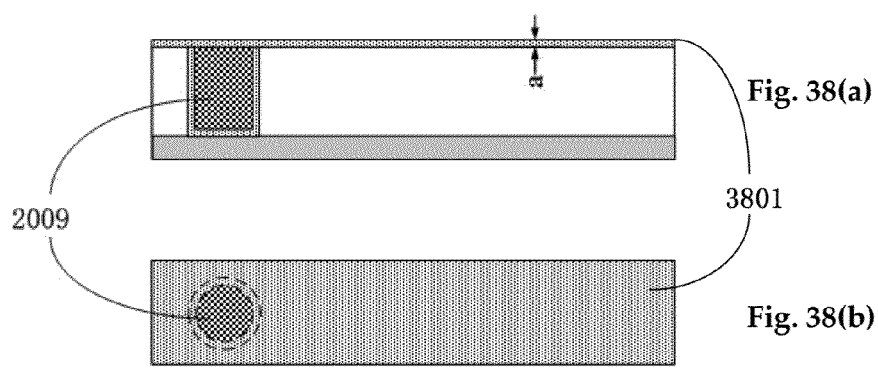
Fig. 38(a)
Fig. 38(b)
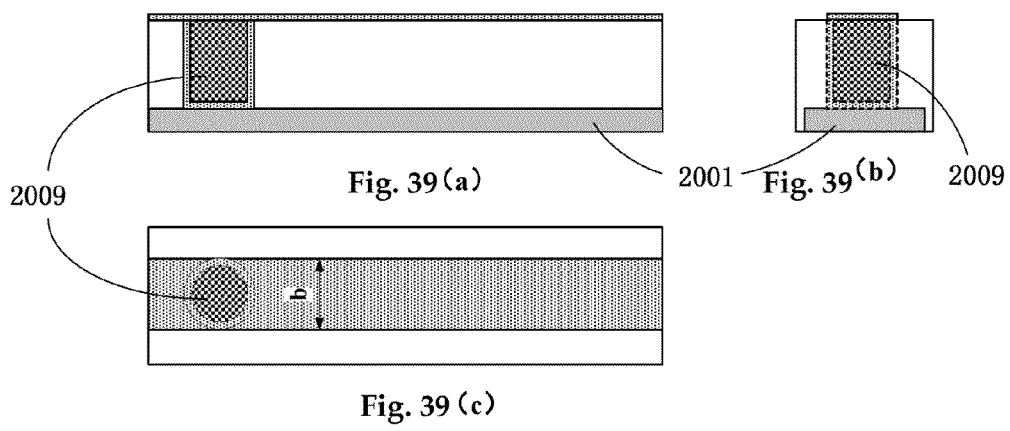
Fig. 39(a)
Fig. 39(b)
Fig. 39(c)

SEMICONDUCTOR MEMORY DEVICE AND MANUFACTURING METHOD THEREOF

CROSS-REFERENCE TO RELATED APPLICATIONS

This application is a divisional application of U.S. application Ser. No. 13/675,975 (filed on Nov. 13, 2012), which claims priority to or is related to Chinese Patent Application No. 201110295406.3 (filed on Sep. 27, 2011); the prior applications are incorporated herein by reference.

BACKGROUND OF THE INVENTION

1. Field of the Invention

The present invention relates to a semiconductor memory device and a manufacturing method thereof.

2. Description of the Related Art

A phase-change memory (PCM), such as a phase-change random access memory (PCRAM), can be of high storage density and high endurance, and can be written and/or read with high speed and driven with low drive current.

FIG. 1 illustrates a diagram illustrating a memory cell 100 of a PCRAM device having a buried electrode contact (BEC). As shown in FIG. 1, the memory cell 100 has a first insulating layer 107 in which a lower via, a BEC, is formed, wherein the lower via contacts a first electrode 101 and comprises a liner 103 and a metal plug 105. For example, the liner 103 can be formed of titanium nitride (TiN), while the metal plug 105 embedded in the liner 103 can be formed of one or more of copper, aluminium, tungsten, nickel and/or one or more of other metals, an alloy of some of these metals, or a stack of some of these metals. The lower via contacts a phase-change material layer 113 (which may be a phase-change material island or phase-change material island-shaped layer) that is formed in a second insulating layer 109; the lower via serves as an electrode for the phase-change material layer 113. A second electrode 115 is provided on the phase-change material layer 113 and can be a contact or a via, for example. A third insulating layer 111 is formed to cover the second electrode 115.

A small electrode contact area in a PCRAM device is critical for reducing the drive current and device size.

As indicated by the double-arrow line in FIG. 1, the BEC (i.e., the lower via) has a critical dimension (width or diameter) of about 70 nm. Given existing standard contact processes, it is difficult to directly form a BEC with a 70 nm critical dimension using a patterning process at the 180 nm or 130 nm process node. On the other hand, an advanced process capable of patterning 70 nm critical dimensions may substantially increase the process cost and/or the equipment cost.

SUMMARY

One or more embodiments of the invention may be related to a semiconductor memory device. The semiconductor memory device may include a first insulating portion. The semiconductor memory device may further include a phase-change material element that contacts the first insulating portion. For example, a bottom surface or a top surface of the phase-change material element may contact the first insulating portion. The semiconductor memory device may further include a first electrode that contacts a first side surface of the phase-change material element, the first side surface of the phase-change material element being not parallel to a top surface of the first electrode. The semiconductor memory device may further include a second insulating portion surrounding the phase-change material element.

In one or more embodiments, the phase-change material element extends into the first insulating portion.

In one or more embodiments, the first electrode is narrower than the phase-change material element in a direction parallel to the first side surface of the phase-change material element.

In one or more embodiments, a thickness of the first electrode is smaller than a width of the first electrode.

In one or more embodiments, the semiconductor memory device may include a first via comprising a liner and a metal plug disposed between two portions of the liner. The first electrode and the liner are formed from a continuous layer of a same material.

In one or more embodiments, the semiconductor memory device may include a second electrode contacting a second side surface of the phase-change material element, the second side surface of the phase-change material element being not parallel to a top surface of the second electrode. The second side surface of the phase-change material element may be substantially parallel to and/or opposite the first side surface of the phase-change material element.

In one or more embodiments, the first electrode, the second electrodes, and a liner of a via are formed from a continuous layer of a same material.

In one or more embodiments, the semiconductor memory device may include a second electrode contacting the top surface of the phase-change material element.

In one or more embodiments, part of the second insulating portion is disposed between the first electrode and the first insulating portion.

One or more embodiments of the invention may be related to a method for manufacturing a semiconductor memory device. The method may include the following steps: providing a first insulating portion; forming an electrode layer that overlaps the first insulating portion; patterning the electrode layer to reduce a width of the electrode layer; forming a second insulating portion; forming an opening that penetrates through the second insulating portion and the electrode layer to form at least a first electrode; and forming a phase-change material element in the opening, wherein the first electrode contacts a first side surface of the phase-change material element, the first side surface of the phase-change material element being not parallel to a top surface of the first electrode.

In one or more embodiments, the phase-change material element extends into the first insulating portion.

In one or more embodiments, the first electrode is formed narrower than the phase-change material element in a direction parallel to the first side surface of the phase-change material element.

In one or more embodiments, a thickness of the first electrode is smaller than a width of the first electrode.

In one or more embodiments, the method may include the following steps: forming a conductive layer on a substrate; forming the first insulating portion on the conductive layer; and forming a through hole in the first insulating portion to penetrate through the first insulating portion, wherein a first portion of the electrode layer covers a portion of the conductive layer exposed by the through hole and covers a sidewall of the through hole.

In one or more embodiments, the method may include the following steps: before patterning the electrode layer, forming a second conductive layer that overlaps the electrode layer and extends into the through hole; and etching-back the second conductive layer to expose at least a portion of the electrode layer and to form a conductive plug of a via in the through hole, wherein the first portion of the electrode layer is used as a liner of the via.

In one or more embodiments, method may include the following steps: forming a conductive layer on a substrate; forming the first insulating portion on the conductive layer; forming a through hole extending to the conductive layer in the first insulating portion; depositing a liner material to cover at least a portion of the first insulating portion, a portion of the conductive layer exposed by the through hole, and a sidewall of the through hole; forming a metal material layer on the liner material; and performing chemical mechanical polishing until a first portion of the metal material layer and a first portion of the liner material, which are disposed on a top surface of the first insulating layer, are removed, resulting in a second portion of the metal material layer and a second portion of the liner material remaining in the through hole, wherein the electrode layer contacts at least one of the second portion of the metal material layer and the second portion of the liner material.

In one or more embodiments, the method may include using the electrode layer to form a second electrode when forming the opening, wherein the second electrode contacts a second side surface of the phase-change material element.

In one or more embodiments, the method may include the following steps: forming a third insulating layer to cover the phase-change material element and the second insulating portion; and forming a via penetrating through the third insulating layer and the second insulating layer and extending to the second electrode.

In one or more embodiments, the method may include the following step: forming a second electrode that contacts a top surface of the phase-change material layer.

In one or more embodiments, the step of forming the phase-change material element may include the following steps: forming a phase-change material layer that overlaps the second insulating portion and fills the opening; performing chemical mechanical polishing on the phase-change material layer to form the phase-change material element such that a top surface of the phase-change material element is substantially flush with a top surface of the second insulating layer.

One or more embodiments of the invention may be related to a semiconductor memory device that may include the following elements: a first phase-change material layer embedded in an insulating material; and a first electrode that laterally contacts the first phase-change material layer.

In one or more embodiments, at a contact surface of the first electrode with the first phase-change material layer, a width, b, of the first electrode is smaller than a size, c, of the first phase-change material layer in a direction along the width.

In one or more embodiments, at a contact surface of the first electrode with the first phase-change material layer, a thickness, a, of the first electrode is smaller than the width, b, of the first electrode.

In one or more embodiments, the semiconductor memory device may include the following elements: a first via electrically connected to the first electrode, wherein the first via comprises a liner and a metal plug.

In one or more embodiments, the first electrode together with the liner of the first via electrically connected to the first electrode are formed from a continuous layer of a same material.

In one or more embodiments, the first electrode is formed of titanium nitride, tantalum nitride, or titanium.

In one or more embodiments, the first electrode is a flat bar-shape conductor.

In one or more embodiments, the semiconductor memory device may include a second electrode in contact with the first phase-change material layer.

In one or more embodiments, the semiconductor memory device may include a second via electrically connected to the second electrode.

In one or more embodiments, the second electrode laterally contacts the first phase-change material layer.

In one or more embodiments, the second electrode is formed of titanium nitride, tantalum nitride, or titanium.

In one or more embodiments, at contact surfaces of the second electrodes with the first phase-change material layer, a width, b, of the second electrode is smaller than a size, c, of the first phase-change material layer in a direction along the width of the first electrode.

In one or more embodiments, at a contact surface of the second electrode with the first phase-change material layer, a thickness, a, of the second electrode is smaller than the width, b, of the second electrode.

In one or more embodiments, the second electrode is a flat bar-shaped conductor.

In one or more embodiments, the first and second electrodes together with the liner of the first via electrically connected to the first electrode are formed from a continuous layer of the same material.

In one or more embodiments, the second electrode contacts and covers the upper surface of the first phase-change material layer.

In one or more embodiments, the semiconductor memory device may include a second via electrically connected to the second electrode, and the second via is located on the second electrode.

In one or more embodiments, the second electrode extends beyond an edge of an upper surface of the first phase-change material layer, and the second via is located on a portion of the second electrode that extends beyond the edge of the upper surface of the first phase-change material layer.

In one or more embodiments, the second via is substantially aligned with the first via electrically connected to the first electrode in a vertical direction.

In one or more embodiments, the semiconductor memory device may include the following elements: a second phase-change material layer embedded in the insulating material; and a third electrode and a fourth electrode that are in contact with the second phase-change material layer; wherein the third electrode laterally contacts a side surface of the second phase-change material layer; and wherein the third electrode is electrically connected to the first electrode and the fourth electrode is not connected to the second electrode.

One or more embodiments of the invention may be related to a method for manufacturing a semiconductor memory device. The method may include the following steps: providing a substrate with a first insulating layer formed thereon; forming an electrode layer over the first insulating layer; patterning the electrode layer; forming a second insulating layer to at least cover the patterned electrode layer; forming an opening that penetrates through the second insulating layer and the electrode layer; and forming a phase-change material layer in the opening, wherein the patterned electrode layer laterally contacts the phase-change material layer, thereby at least forming a first electrode that laterally contacts the phase-change material layer.

In one or more embodiments, at a contact surface of the first electrode with the phase-change material layer, a width, b, of the first electrode is smaller than a size, c, of the phase-change material layer in a direction along the width of the first electrode.

In one or more embodiments, at a contact surface of the first electrode with the first phase-change material layer, a thickness, a, of the first electrode is smaller than the width, b, of the first electrode.

In one or more embodiments, the substrate is also formed thereon with a conductive layer underlying the first insulating layer, wherein a through hole penetrating through the first insulating layer is formed in the first insulating layer, and the step of forming an electrode layer over the first insulating layer causes the electrode layer to cover the bottom surface and sidewall of the through hole. In an embodiment, the method further comprising, before patterning the electrode layer: forming a second conductive layer over the electrode layer; and, performing etch-back of the second conductive layer such that the electrode layer over the first insulating layer is exposed while the second conductive layer material in the through hole is remained, thereby forming a via extending to the conductive layer.

In one or more embodiments, the electrode layer that covers the bottom surface and sidewall of the through hole is used as a liner of the first via.

In one or more embodiments, the substrate is formed thereon with a conductive layer underlying the first insulating layer, a through hole penetrating through the first insulating layer to the conductive layer is formed in the first insulating layer, the via comprising a liner and a metal plug.

In one or more embodiments, the step of providing a substrate comprises: forming a through hole extending to the conductive layer in the first insulating layer; depositing a liner material to cover the first insulating layer as well as the bottom surface and sidewall of the through hole; forming a metal material layer over the liner material; and performing chemical mechanical polishing until the metal material layer and the liner over the first insulating layer are removed.

In one or more embodiments, the electrode layer and the liner layer of the via are formed from a same material or different materials.

In one or more embodiments, the electrode layer is formed of titanium nitride, tantalum nitride, or titanium.

In one or more embodiments, the first electrode is a flat bar-shaped conductor.

In one or more embodiments, the patterned electrode layer laterally contacts the opposite sides of the phase-change material layer, thereby forming the first electrode and a second electrode that laterally contacts the phase-change material layer.

In one or more embodiments, the second electrode is formed of titanium nitride, tantalum nitride, or titanium.

In one or more embodiments, at a contact surface of the second electrode with the phase-change material layer, a width, b, of the second electrode is smaller than a size, c, of the phase-change material layer in a direction along the width.

In one or more embodiments, at a contact surface of the second electrode with the phase-change material layer, a thickness, a, of the second electrode is smaller than the width, b, of the second electrode.

In one or more embodiments, the second electrode is a flat bar-shaped conductor.

In one or more embodiments, the method may include the following steps: forming a third insulating layer to cover the phase-change material layer and the second insulating layer; and forming a via penetrating through the third insulating layer and the second insulating layer and extending to the second electrode.

In one or more embodiments, the method may include forming a second electrode over the second insulating layer and the phase-change material layer, the second electrode substantially covers the upper surface of the phase-change material layer.

In one or more embodiments, the method may include the following steps: forming a third insulating layer over the second insulating layer and the second electrode; and forming a via penetrating through the third insulating layer and extending to the second electrode.

In one or more embodiments, the second electrode extends beyond an edge of an upper surface of the phase-change material layer, and the second via is located on a portion of the second electrode that extends beyond the edge of the upper surface of the phase-change material layer.

In one or more embodiments, the via extending to the second electrode is substantially aligned with the via electrically connected to the first electrode in a vertical direction.

In one or more embodiments, the step of forming a phase-change material layer in the opening comprises: forming a phase-change material layer on the second insulating layer so as to fill up the opening; performing chemical mechanical polishing on the formed phase-change material layer such that the upper surface of the phase-change material layer is substantially flush with the upper surface of the second insulating layer, thereby forming the phase-change material layer.

In one or more embodiments, a plurality of semiconductor memory devices is stacked in a direction perpendicular to a bottom surface of the substrate.

One or more embodiments of the invention may be related to a semiconductor memory that may include the following elements: a first insulating layer; a phase-change material layer over the first insulating layer; a first electrode over the first insulating layer, wherein the first electrode laterally contacts the phase-change material layer; and a second insulating layer over the first insulating layer, the second insulating layer surrounding the phase-change material layer.

On or more embodiments of the invention may be related to a method of manufacturing a semiconductor memory device. The method may include the following steps: providing a substrate with a first insulating layer formed thereon; forming an electrode layer over the first insulating layer; patterning the electrode layer; forming a second insulating layer to at least cover the patterned electrode layer; forming an opening that penetrates through the second insulating layer and the electrode layer; and forming a phase-change material layer in the opening, wherein the patterned electrode layer laterally contacts the phase-change material layer, thereby at least forming a first electrode that laterally contacts the phase-change material layer.

Embodiments of the present invention will become apparent from the following detailed description with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention. The present invention can be better understood by the following detailed descriptions with reference to the accompanying drawings, in which:

FIG. 7, FIG. 8, FIG. 9, FIG. 10, FIG. 11, and FIG. 12 illustrate steps in a method of manufacturing a semiconductor memory device according to one or more embodiments of the present invention;

FIG. 13(a), FIG. 13(b), FIG. 13(c), FIG. 14(a), FIG. 14(b), FIG. 15, FIG. 16, FIG. 17, FIG. 18, and FIG. 19 illustrate steps in a method of manufacturing a semiconductor memory device according to one or more embodiments of the present invention;

FIG. 20, FIG. 21(a), FIG. 21(b), FIG. 22(a), FIG. 22(b), FIG. 22(c), FIG. 23(a), FIG. 23(b), FIG. 24, FIG. 25, FIG. 26, FIG. 27, and FIG. 28 illustrate steps in a method of manufacturing a semiconductor memory device according to one or more embodiments of the present invention;

FIG. 29(a), FIG. 29(b), FIG. 29(c), FIG. 30(a), FIG. 30(b), FIG. 31, FIG. 32, FIG. 33, FIG. 34, FIG. 35, and FIG. 36 illustrate steps in a method of manufacturing a semiconductor memory device according to one or more embodiments of the present invention;

FIG. 37, FIG. 38(a), FIG. 38(b), FIG. 39(a), FIG. 39(b), and FIG. 39(c) illustrate steps in a method of manufacturing a semiconductor device according to one or more embodiments of the present invention.

It should be appreciated that these drawings are merely illustrative and are not intended to limit the scope of the disclosure. In the figures, various elements have not been drawn strictly to scale or according to their actual shapes, wherein some elements (e.g. layers or parts) can be magnified with respect to other elements, for the purpose of more clearly explaining the principles of the present invention. Moreover, those details that would otherwise obscure the gist of the present disclosure may not be shown in the figures.

DETAILED DESCRIPTION

One or more embodiments of the present disclosure will be described below in conjunction with the accompanying drawings.

Note that in the figures, reference numbers for the same components, elements, or objects may not be repeatedly shown; those reference numbers that need to be emphasized may be repeatedly shown.

Various embodiments are described herein below, including methods and techniques. It should be kept in mind that the invention might also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Although the terms first, second, third etc. maybe used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, third etc. may also be used herein to differentiate different categories of elements. For conciseness, the terms first, second, third, etc. may represent first-category, second-category, third-category, etc., respectively.

Figure 2A:
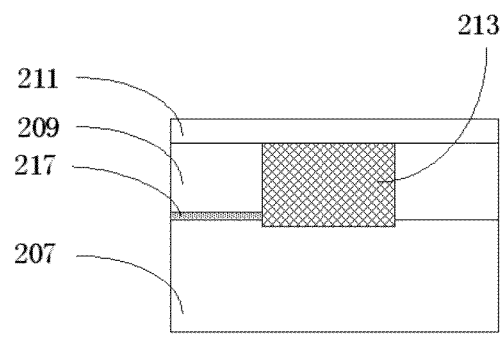
FIG. 2A, FIG. 2B, and FIG. 2C illustrate arrangements of one or more electrodes and phase-change material in a memory device according to one or more embodiments of the present invention.
Figure 2B:
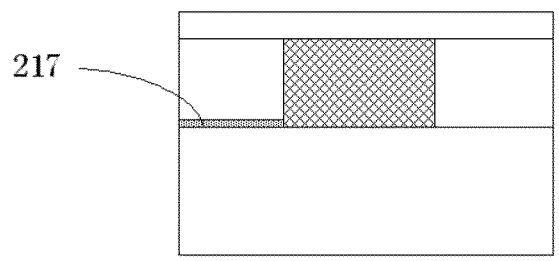
Figure 2C:
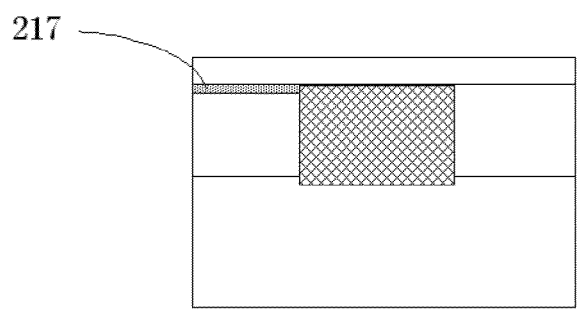

FIGS. 2A-2C illustrate examples of arrangements of one or more electrodes and a phase-change material (island-shaped) layer in a semiconductor memory device according to one or more embodiments of the present invention. As illustrated in FIG. 2A, a semiconductor memory device according to one or more embodiments of the present invention may comprise a phase-change element 213 or phase-change material (island-shaped) layer 213 (which also can be referred as a first phase-change material island-shaped layer, as can be understood from the description hereunder) embedded in one or more insulating elements (e.g., 211, 209 and 207); the semiconductor memory device may further comprise an electrode 217 (which also can be referred to as a first electrode) that laterally connects (to a side surface of) the first phase-change material island-shaped layer. In some embodiments, as described below in conjunction with FIG. 6, the electrode is generally configured such that at a contact surface of the electrode (e.g. 217) with the phase-change material island-shaped layer, the width of the electrode is larger than the thickness of the electrode, so as to reduce the contact area of the electrode with the phase-change material island-shaped layer. In some embodiments, the electrode 217 can be a flat bar-shaped conductor. In one or more embodiments, the electrode 217 may have one or more other shapes. In one or more embodiments, the semiconductor memory device may not be a PCRAM.

In a number of embodiments, the insulating layers 207, 209 and 211 can be formed over a substrate (not shown) and/or an underlying layer. For example, the substrate may be or may include one or more of a mono-crystalline silicon substrate, a poly-silicon substrate, a semiconductor-on-insulator (SOI) substrate, a glass substrate, a sapphire substrate, a metal (e.g. stainless) substrate, a plastic substrate, etc. The phase-change material can be an alloy of chalcogenide, such as GST (Ge—Sb—Te, germanium-antimony-tellurium). In one or more embodiments, the phase-change element may include one or more other phase-change materials.

It should be understood that the lateral direction may be defined with respect to the phase-change material island-shaped layer and has a meaning as commonly known. The lateral direction can also be understood as a direction substantially parallel to a bottom surface of the phase-change element 213 and/or parallel to a top surface or a bottom surface of the substrate. Since the substrate is generally placed horizontally, generally, the lateral direction can also be understood as a substantially horizontal direction.

In one or more embodiments, as illustrated in FIG. 2A, a bottom portion of the phase-change elements extends into the insulating layer 207, and the bottom surface of the phase-change element 213 is disposed below the bottom surface of the electrode 217 and is disposed below the interface between the insulating layers 207 and 209.

FIG. 2B illustrates an example of an arrangement of an electrode and a phase-change element (or phase-change material island-shaped layer) in a semiconductor memory device according to one or more embodiments. As illustrated in FIG. 2B, the electrode 217 laterally contacts the phase-change material island-shaped layer 213 at the lowest end of the side surface of said phase-change material island-shaped layer 213. The surface of the electrode 217 is substantially flush with (and aligned with) the bottom surface of the phase-change material island-shaped layer 213. In one or more embodiments, in order to realize the lateral contact between the electrode and the phase-change material island-shaped layer, over-etching maybe performed after forming the electrode 217 and during the process of forming an opening for the phase-change material. If the over-etching substantially stops at the top surface of the insulating layer 207, the arrangement illustrated in FIG. 2B may be formed. If a part of the insulating material under the opening is also etched in the over-etching, a recess on the insulating layer 207 maybe formed, and the phase-change element 213 may extend into the insulating layer 207, resulting in the arrangement illustrated in FIG. 2A.

FIG. 2C illustrates an example of an arrangement of an electrode and a phase-change material island-shaped layer in a semiconductor memory device according to one or more embodiments. As illustrated in FIG. 2C, the electrode 217 connects to the phase-change material island-shaped layer 213 at the upper end of the side wall of the phase-change material island-shaped layer 213. The top surface of the electrode 217 is substantially flush with (and aligned with) the upper surface of the phase-change material island-shaped layer 213. In one or more embodiments, the combination of the insulating layer 207 and the insulating layer 209 may represent an integral insulating layer and can be, as a whole, formed from one insulating material layer instead of being formed from two insulating material layers.

As illustrated in FIGS. 2A-2C, the electrode 217 may be disposed between the insulating layers 207 and 209 or between the insulating layers 209 and 211.

The phase-change material island-shaped layer can be regarded as being embedded in an insulating material that includes the elements 211, 209 and 207. The insulating layer 211 illustrated in FIGS. 2A-2C can facilitate the forming of an electrical connection (e.g. a wire or via) to the phase-change material island-shaped layer 213 and can electrically and/or thermally insulate the phase-change material island-shaped layer 213 from materials (such as metal wiring) disposed on the insulating layer 211. In one or more embodiments, the semiconductor memory device may not include the insulating layer 211. In one or more embodiments, metal wiring (analogous to the metal wiring 115 illustrated in FIG. 1) may directly contact and cover the phase-change material island-shaped layer 213 and may be disposed between the phase-change element 213 and the insulating layer 211, and the insulating layer 211 can serve as a passivation layer and/or an interlayer insulating layer.

Figure 1:
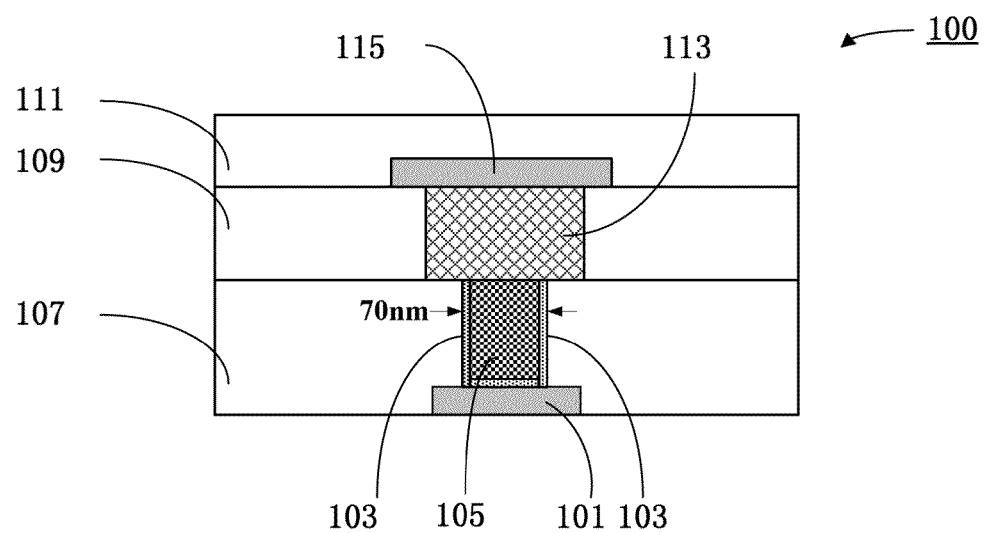
FIG. 1 is a schematic diagram illustrating a conventional memory cell 100 of a phase-change memory having a BEC.

In one or more embodiments, the semiconductor memory device may include one or more other electrodes that are analogous to one or more electrodes illustrated in FIG. 1.

FIGS. 3A-3E illustrate examples of arrangements of one or more electrodes and a phase-change material island-shaped layer in a semiconductor memory device, such as a PCRAM device, according to one or more embodiments of the present invention.

Figure 3A:
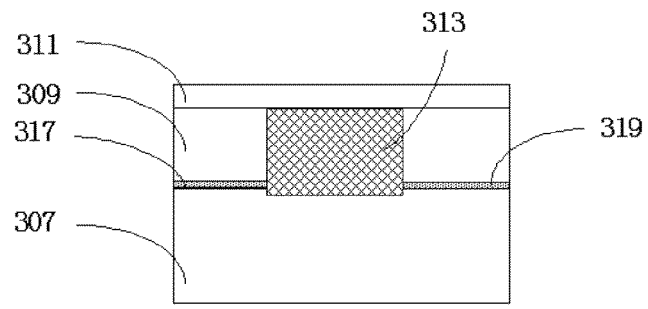
FIG. 3A, FIG. 3B, FIG. 3C, FIG. 3D, and FIG. 3E illustrate examples in arranging one or more electrodes and a phase-change material (island-shaped) layer in a semiconductor memory device (e.g., a PCRAM device) according to one or more embodiments of the present invention.
Figure 3B:
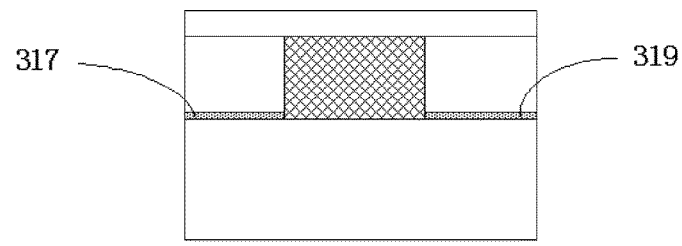
Figure 3C:
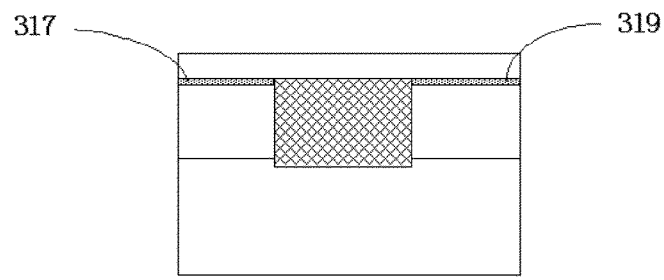

The arrangements illustrated in FIGS. 3A-3C include elements analogous to elements in the situations illustrated in FIGS. 2A-2C, respectively. In addition to the first electrode 317, the second electrode 319 may be included. As illustrated in FIGS. 3A, 3B, and 3C, the second electrode 319 may laterally contact the phase-change material island-shaped layer. In one or more embodiments, the contact area associated with each of the electrodes 317 and 319 may be substantially smaller than the contact area associated with the electrode 217 illustrated in FIGS. 2A-2C. In one or more embodiments, the second electrode 319 is configured such that at a contact surface of the second electrode 319 with the phase-change material island-shaped layer, the width of the second electrode 319 is larger than the thickness of the second electrode 319, thereby reducing the contact area of the second electrode with the phase-change material island-shaped layer. In some embodiments, the second electrode 319 can be a flat bar-shaped conductor so as to reduce its contact area with the phase-change material island-shaped layer. In one or more embodiments, the second electrode 319 may have one or more other shapes. The second electrode 319 may be disposed between the insulating elements 307 and 309 or between the insulating elements 309 and 311.

Figure 3D:
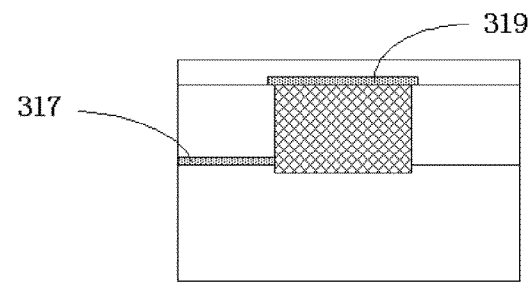
Figure 3E:
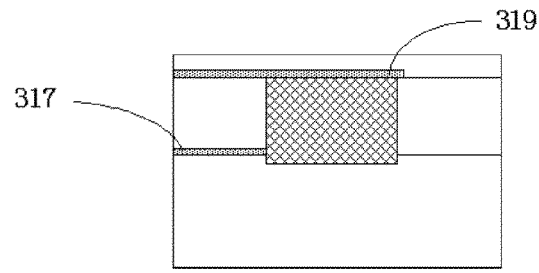

In one or more embodiments, as illustrated in FIGS. 3D and 3E, the second electrode 319 is formed over the phase-change material island-shaped layer 313 and contacts the upper surface (or top surface) of the phase-change material island-shaped layer 313. In one or more embodiments, the second electrode 319 substantially covers the upper surface of the phase-change material island-shaped layer 313 such that the phase-change material can be prevented from being etched during the electrode patterning process. In one or more embodiments, as illustrated in FIG. 3E, the second electrode 319 extends substantially beyond at least one edge of the phase-change material island-shaped layer 313, so as to form an electrical connection (for example, upper via, as illustrated in FIG. 4D and described below) to an element that is not aligned with the phase-change element.

In one or more embodiments, the first electrode and/or the second electrode can be formed of one or more of titanium nitride (TiN), tantalum nitride (TaN), and Titanium. In one or more embodiments, the first electrode and/or the second electrode can be formed of same or different suitable conductive and/or semiconductive materials.

In one or more embodiments, as will be described later, the semiconductor memory device may further comprise a first wiring or a first via electrically connected to the first electrode, and/or a second wiring or a second via electrically connected to the second electrode.

FIGS. 4A-4D illustrate semiconductor memory devices according to one or more embodiments of the present invention.

Figure 4A:
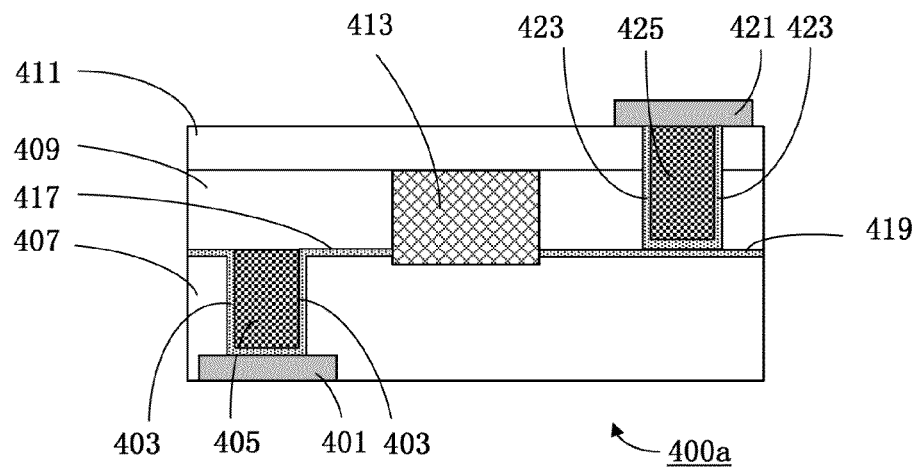
FIG. 4A, FIG. 4B, FIG. 4C, and FIG. 4D illustrate semiconductor memory devices according to one or more embodiments of the present invention.

As illustrated in FIG. 4A, the semiconductor memory device 400a may comprise a phase-change material island-shaped layer 413 (or phase-change element 413) embedded in an insulating material (including elements 407, 409 and 411).

The semiconductor memory device 400a may further comprise a first electrode 417 and a second electrode 419 that laterally contact opposite side surfaces of the phase-change material island-shaped layer 413. The semiconductor memory device 400a may further comprise a via (which can be referred to as a lower via or a first via) electrically connected to the first electrode 417. The lower via can comprise a liner 403 and a metal plug 405. In one or more embodiments, the liner 403 of the lower via, the first electrode 417, and the second electrode 419 are formed from a continuous layer of a same material, which may include one or more of titanium nitride (TiN), tantalum nitride (TaN), and titanium. The electrodes 417 and 419 can be formed by the process of forming via liner in a via formation process cycle using a liner material (such as TiN material). The electrode layer for forming the electrodes 417 and 419 can be formed simultaneously with the liner 403 of the lower via in a liner forming step in the via formation process cycle. In one or more embodiments, the electrodes 417 and 419 can be made of one or more suitable conductive materials different from the via liner material. In one or more embodiments, the electrode layer is formed using the liner material in a via formation process cycle; advantageously, several process steps can be saved and the process becomes simple. The metal plug 405 can be formed using one or more of copper, aluminium, tungsten, nickel, and an alloy or stack of some of these metals through one or more of sputtering, electroplating, electroless plating, etc.

The semiconductor memory device 400a may further comprise a via (which is also referred as an upper via or a second via) electrically connected to the second electrode 419. The upper via can comprise a liner 423 and a metal plug 425. The materials for forming the liner 423 and the metal plug 425 can be the same as or different from the materials for forming the liner 403 and the metal plug 405, respectively. In one or more embodiments, the semiconductor memory device 400a can further comprise conductors (e.g. wirings) 401 and 421 that are respectively electrically connected to the upper via and the lower via.

It should be understood that the materials and methods for forming the liners and the metal plugs of the vias are not limited to the materials and methods discussed above. One skilled in the art can freely select suitable materials and methods as needed or based on design requirements. Further, it should be understood that the upper via and the lower via mentioned herein are merely illustrative, and one skilled in the art can select suitable manners for the connections between either of the first and second electrodes and other layers, components, or elements as needed. In one or more embodiments, one or both of the vias can be replaced by one or more of wiring(s), doped semiconductor layer(s), etc.

Figure 4B:
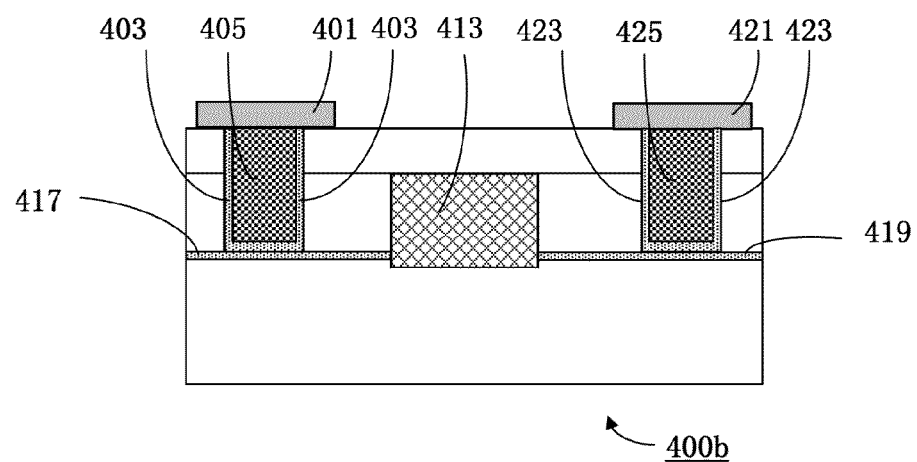

FIG. 4B illustrates a semiconductor memory device 400b according to one or more embodiments of the present invention. As illustrated in FIG. 4B, the semiconductor memory device 400b comprises two upper vias that are respectively electrically connected to the first electrode 417 and the second electrode 419.

Additionally or alternatively, the device 400b may comprise two lower vias that are respectively connected to the first electrode 417 and the second electrode 419. One or both of the lower vias maybe analogous to the lower via discussed with reference to FIG. 4A.

Figure 4C:
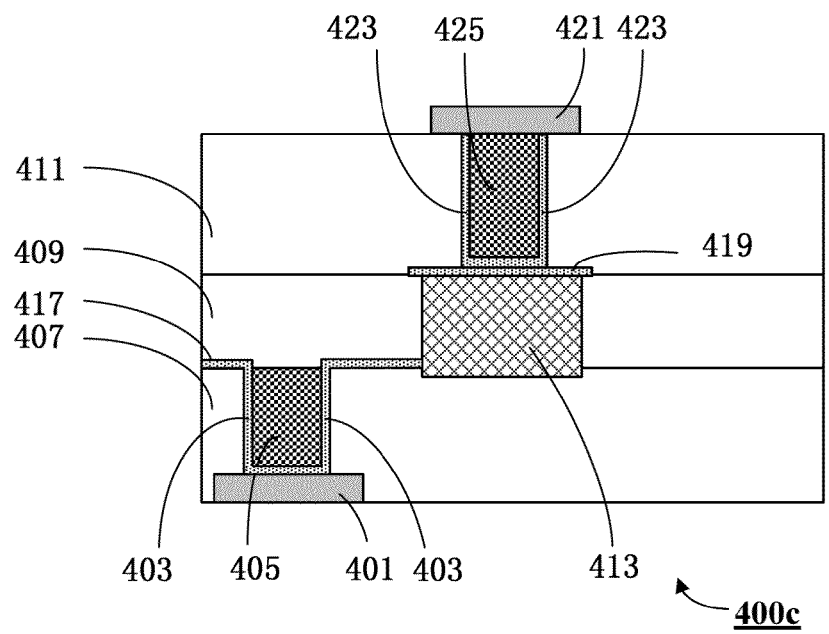
Figure 4D:
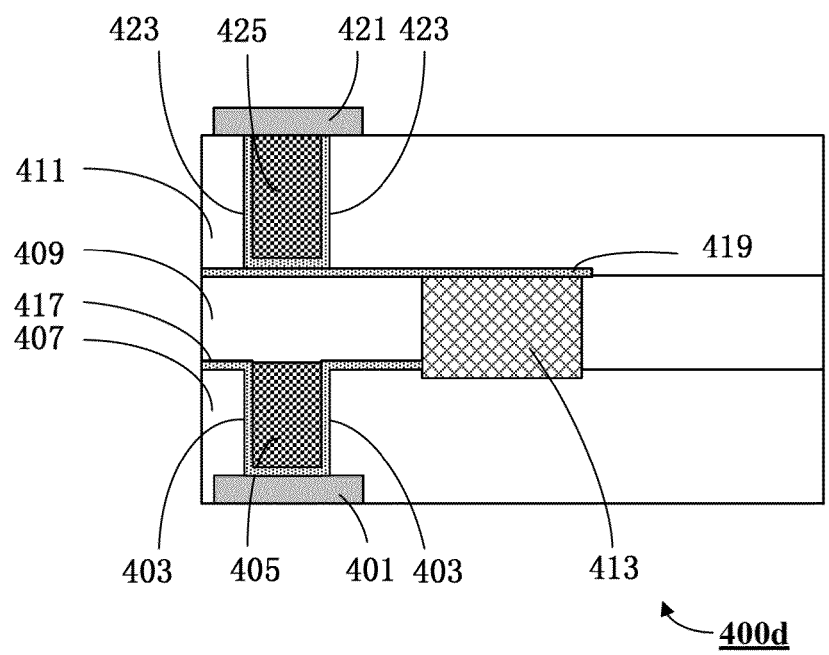

FIG. 4C illustrates a semiconductor memory device 400c according to one or more embodiments of the present invention. The semiconductor memory device 400c may comprise a phase-change material island-shaped layer 413 (or phase-change element 413) embedded in an insulating material (which may include elements 407, 409 and 411). The semiconductor memory device 400c may comprise a first electrode 417 that laterally contacts to a side surface of the phase-change material island-shaped layer 413. The semiconductor memory device 400c may comprise a second electrode 419 that is located over the phase-change material island-shaped layer 413 and contacts the upper surface (or top surface) of the phase-change material island-shaped layer 413. The upper surface of the phase-change element 413 may be substantially perpendicular to the side surface of the phase-change element 413. In one or more embodiments, the second electrode 419 substantially covers the upper surface of the phase-change material island-shaped layer 413, so as to protect the phase-change material island-shaped layer during etching performed for the patterning of the electrode. In one or more embodiments, the second electrode 419 can be formed from TiN. In one or more embodiments, the second electrode 419 can be implemented using a suitable conductive material or a stack of conductive materials.

The semiconductor memory device 400c may further comprise a lower via electrically connected to the first electrode 417, wherein the lower via can comprise a liner 403 and a metal plug 405. The semiconductor memory device 400c may further comprise an upper via that is located over the second electrode 419 and electrically connected to the second electrode 419. The upper via can comprise a liner 423 and a metal plug 425. In one or more embodiments, the semiconductor memory device 400a can further comprise conductors (such as wirings) 401 and 421 that are respectively electrically connected to the lower via and the upper via.

FIG. 4D illustrates a semiconductor memory device 400d according to one or more embodiments of the present invention. In the semiconductor memory device 400d, the second electrode 419 not only covers the upper surface of the phase-change material island-shaped layer 413, but also extends beyond the edge of the upper surface of the phase-change material island-shaped layer 413, and an upper via comprising the liner 423 and the metal plug 425 is formed over a portion of the second electrode 419 that extends beyond the edge of the upper surface of the phase-change material island-shaped layer 413. In one or more embodiments, the upper via is substantially aligned with the lower via connected to the first electrode 417 in a longitudinal direction (or in a vertical direction) that is substantially perpendicular to the extension direction of the second electrode 419 and/or substantially perpendicular to the upper surface of the phase-change element 413. One skilled in the art would appreciate that the manufacturing process for device 400d may be substantially similar to that for device 400c.

Figure 5:
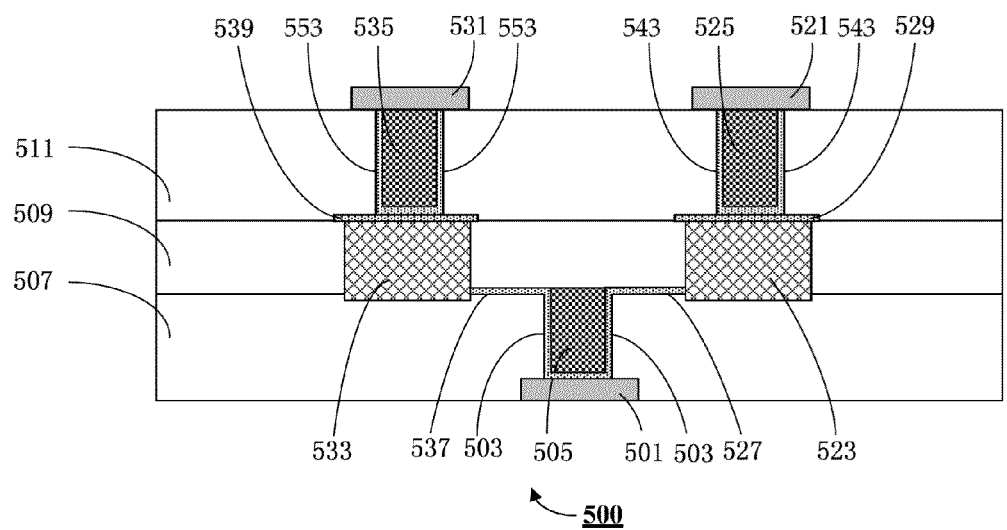
FIG. 5 illustrates a semiconductor memory device according to one or more embodiments of the present invention.

FIG. 5 illustrates a semiconductor memory device 500 according to one or more embodiments of the present invention. The semiconductor memory device 500 may comprise a first phase-change material island-shaped layer 523 (or phase-change element 523) and a second phase-change material island-shaped layer 533 (or phase-change element 522). The semiconductor memory device 500 may further comprise a first electrode 527 and a second electrode 529 that contact the first phase-change material island-shaped layer 523, wherein the first electrode 527 laterally contacts a side surface of the first phase-change material island-shaped layer 523, and wherein the second electrode 529 contacts the top surface (or upper surface) of the first phase-change material island-shaped layer 523. The semiconductor memory device 500 may further comprise a third electrode 537 and a fourth electrode 539 that contact the second phase-change material island-shaped layer 533, wherein the third electrode 537 laterally contacts a side surface of the second phase-change material island-shaped layer 533, and wherein the fourth electrode 539 contacts the top surface (or upper surface) of the second phase-change material island-shaped layer 533.

Each of the first electrode 527 and the third electrode 537 may be disposed between the insulating layers 507 and 509. Each of the second electrode 529 and the fourth electrode 539 may be disposed between the insulating layers 509 and 511.

The second electrode 529 is located over the first phase-change material island-shaped layer 523 and contacts the upper surface of the first phase-change material island-shaped layer 523. In one or more embodiments, the second electrode 529 substantially covers the upper surface of the first phase-change material island-shaped layer 523. The fourth electrode 539 is located over the second phase-change material island-shaped layer 533 and contacts the upper surface of the second phase-change material island-shaped layer 533. In one or more embodiments, the fourth electrode 539 substantially covers the upper surface of the second phase-change material island-shaped layer 533.

The semiconductor memory device 500 may further comprise a lower via electrically connected to the first electrode 527 and the third electrode 537. The lower via can comprise a liner 503 and a metal plug 505. The first electrode 527 and the third electrode 537 may be electrically connected to each other through the line 503 and/or through the metal plug 505.

The semiconductor memory device 500 may further comprise a first upper via that is located over the second electrode 529 and electrically connected to the second electrode 529, wherein the second electrode 529 may be disposed between the first upper via and the first phase-change element 523, wherein the first upper via can comprise a liner 543 and a metal plug 525, and wherein a portion of the liner 543 is disposed between the metal plug 525 and the second electrode 529. The semiconductor memory device 500 may further comprise a second upper via that is located over the fourth electrode 539 and connected to the fourth electrode 539, wherein the second upper via can comprise a liner 553 and a metal plug 535. In one or more embodiments, the second electrode 529 and the fourth electrode 539 are not electrically connected to each another.

In one or more embodiments, the semiconductor memory device 500 can further comprise wirings 501, wirings 521, and wirings 531 that are electrically connected to the lower via, the first upper via, and the second upper via, respectively.

One skilled in the art can readily understand that one or more of the elements discussed with reference to FIG. 5 can be combined with one or more elements discussed with reference to one or more of FIGS. 4A-4E as well as other known elements.

Although FIG. 5 illustrates an example of two memory cells disposed in a plane parallel to the bottom surface of the insulating layer(s) and/or the top surface of the insulating layer(s), the present disclosure is not limited thereto. In one or more embodiments, memory cells can be stacked in a perpendicular direction (perpendicular to the substrate surface and/or perpendicular to the bottom and/or top surface of one or more insulating layers), and thus memory density in a surface area can be increased.

FIGS. 6(a), 6(b), 6(c), and 6(d) illustrate views of a semiconductor memory device according to one or more embodiments of the present invention. The views may clearly illustrate the contact areas between electrodes and a phase-change element. The semiconductor memory device may include one or more elements analogous to one or more elements discussed with reference to FIG. 4A. FIG. 6(a) illustrates a partially exposed view of the device viewed from the top, FIG. 6(b) illustrates a cross-sectional view at line A-A' viewed from the front, FIG. 6(c) illustrates a partially exposed view at line B-B' seen from the right side, and FIG. 6(d) illustrates an enlarged view of a portion of the view illustrated in FIG. 6(c). FIG. 6(d) illustrates the contact area (which corresponds to cross-sectional dimensions thickness axwidth b of the electrode 419) between the electrode 419 and the phase-change material 413. Herein, one or more features described in connection with the second electrode 419 can also be suitably applied to the first electrode 417. For example, the first electrode 417 may also have a thickness a and a width b, and a contact area between the phase-change material 413 and the first electrode 417 also can be defined by the cross-sectional dimensions of the first electrode 417.

Figure 6:
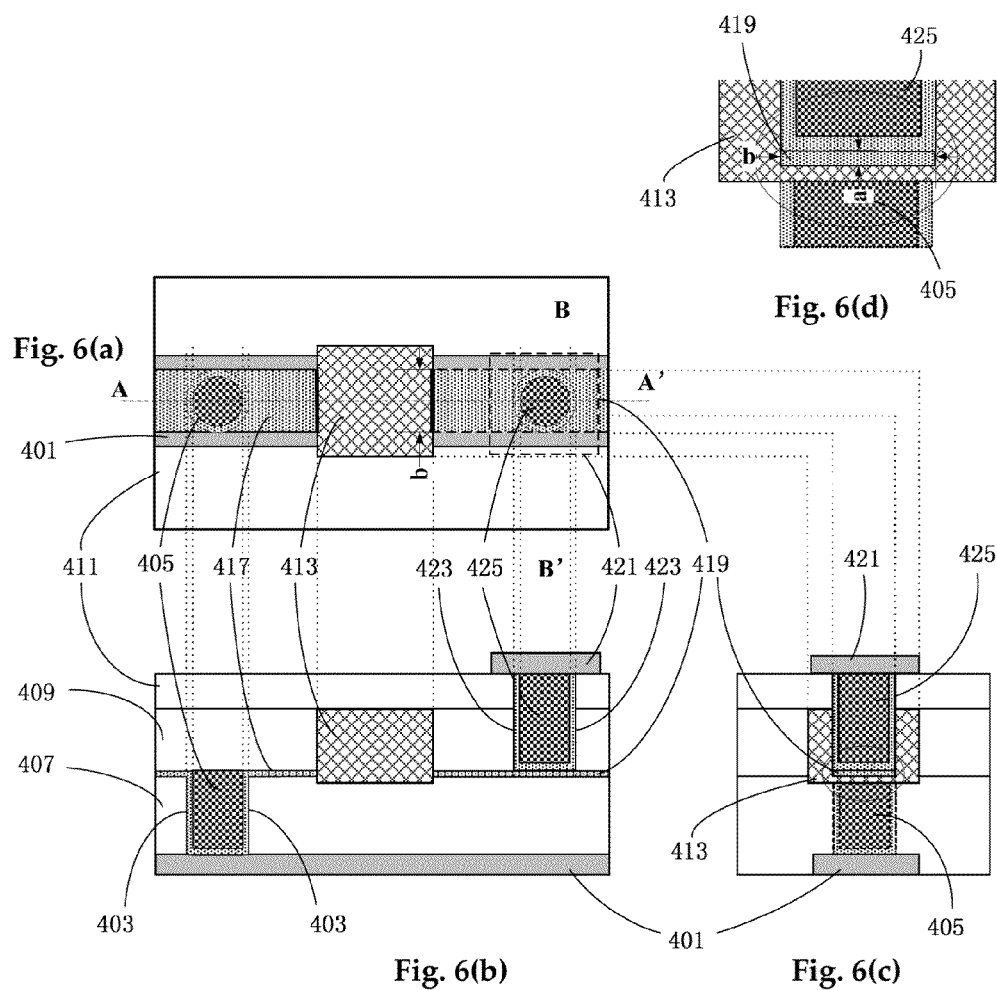
FIG. 6(a), FIG. 6(b), FIG. 6(c), and FIG. 6(d) illustrate views of a semiconductor device according to one or more embodiments of the present invention.

As can be seen from FIG. 6(b), the structure of the device is substantially similar to the structure illustrated in FIG. 4A, except the metal wiring 401. Therefore, reference numbers similar to those illustrated in FIG. 4A may be employed in FIG. 6 to indicate similar components, and detailed descriptions thereof may be omitted.

Note that the two dotted circles illustrated in FIG. 6(a) respectively represent the upper via and the lower via, while the solid circles represent the metal plugs therein, respectfully. The portion between a dotted circle and a solid circle represents the liner 403 or the liner 423. In FIG. 6(c) and FIG. 6(d), the lower via is indicated by a dotted line.

It should be understood that FIGS. 6(a)-6(d) are illustrative and are not intended to limit the scope of the present invention in any manner. It should be understood that various patterns or graphs and their sizes and relative relationships illustrated in FIGS. 6(a)-6(d) are illustrative, unless specifically indicated to the contrary. For example, as for via, although one or more embodiments may employ a via of a circle shape, a via of a square shape or another suitable shape may be alternatively or additionally used. For example, the minimum size of a via can depend on process conditions. Some critical sizes discussed in the background section of this specification are not intended to limit the scope of the present invention, but merely examples.

In one or more embodiments, as illustrated in FIG. 6(a), edges of the first electrode 417 and edge of the second electrode 419 are tangent to the circumference of the lower via and the circumference of the upper via, respectively, in a plan view of the memory device. In one or more embodiments, one or more edges of an electrode and the circumference of a via may have one or more additional or alternative relationships. One or more sizes of one or more of the first electrode, the second electrode, the upper via, and the lower via may depend on design rules and/or manufacturing processes (e.g. lithography and etching); sizes equal to or larger than minimum sizes can be employed. In one or more embodiments, it is contemplated to break through the minimum size allowed by design rules so as to realize a minimum size that can be realized by technologic process as possible. Various relations may be possible between the first/second electrode and the corresponding wiring or via. In one or more embodiments, one or more edges of the first electrode 417 and/or the second electrode 419 can intersect the circumference of the upper via and/or the circumference of the lower via in a plan view of the memory device, give a minimized width b of the first electrode 417 and/or a minimized width b of the second electrode 419. In one or more embodiments, the diameter of a via may be smaller than the width b of the first electrode 417 and/or smaller than the width b of the second electrode 419.

FIG. 6(a) and FIG. 6(b) illustrate that the first electrode 417 laterally contacts a first side of the phase-change material island-shaped layer 413 and that the second electrode 419 laterally contacts a second side (opposite the first side) of the phase-change material island-shaped layer 413. In one or more embodiments, at a contact surface of the electrode with the phase-change material island-shaped layer, the width b of the electrode is smaller than the dimension of the first phase-change material island-shaped layer in a direction of the width, as illustrated in FIGS. 6(a), 6(c), and 6(d).

Since the thickness a of the first electrode 417 and/or the thickness of the second electrode 419 can be controlled by the parameters of associated formation processes (such as one or more of depositing, sputtering, electroplating, etc.), the thickness can be formed to be relatively thin, or even very thin, in view of the width b; for example, the thickness a maybe 20 nm. The width b of the first electrode 417 and/or the width b of the second electrode 419 maybe limited by a lithography process. For example, the width b may be implemented according to a minimum size that is restricted by a via lithography process and may be 70 nm. In one or more embodiments, at the contact surface of an electrode with the phase-change material island-shaped layer, the electrode is configured such that its thickness (a) is smaller than its width (b).

In one or more embodiments of the present invention, the contact area between a first electrode and the phase-change material (island-shaped layer) is 70 nm×20 nm, which is much smaller than that ((35 nm)$^2$×π) associated with a conventional memory device.

In one or more embodiments, the thickness of the electrode may be substantially constant within process tolerance. In one or more embodiments, the width of the electrode may be substantially constant in a direction along its longitudinal axis.

It should be understood that although an electrode is referred to as a first electrode and another electrode is referred to as a second electrode in the present disclosure, these terms, "the first electrode" and "the second electrode", can be interchangeably used, unless specifically indicated to the contrary. For example, in the example illustrated in FIGS. 6(a)-6(d), the electrode 419 can be regarded as the first electrode while the electrode 417 can be regarded as the second electrode.

Below, one or more manufacturing methods of semiconductor memory devices according to one or more embodiments of the present invention will be described in conjunction with the figures.

According to one or more embodiments, a substrate (not shown) is provided on which a first insulating layer 307 is formed. The first insulating layer 307 is illustrated in FIG. 7. As will be described later, the first insulating layer 307 may have a through hole formed therein, so as to form a via to a conductive layer (such as, doped semiconductor layer or wiring layer) underlying the first insulating layer 307.

Next, as illustrated in FIGS. 8(a)-8(b), an electrode layer 305 is formed over the first insulating layer 307, for example, by means of CVD or PECVD. In one or more embodiments, the electrode layer 305 is formed from TiN. The electrode layer 305 may be formed relatively thin (in comparison with the associated width and/or length) and can have a flat bar shape. In one or more embodiments, the thickness a of the electrode layer 305 can be configured smaller than the width b (described later) of the electrode to be formed from this electrode layer 305. In one or more embodiments, the thickness a may be 20 nm.

Subsequently, the electrode layer 305 is patterned, as illustrated in FIGS. 9(a)-9(b). FIG. 9(a) illustrates a front sectional view of the device; FIG. 9(b) illustrates a side view of the device; FIG. 9(c) illustrates a top view of the device. The patterning defines the suitable shape and size of the electrode, for example, illustrated in FIG. 9(b) and FIG. 9(c), in which width b is specifically illustrated. The patterning also defines the basic shape of the electrode, for example, a bar shape or substantially rectangular shape in one or more embodiments. In one or more embodiments, the width b of the electrode is smaller than the width of the phase-change material island-shaped layer to be formed later.

Figures 10A, 10B:
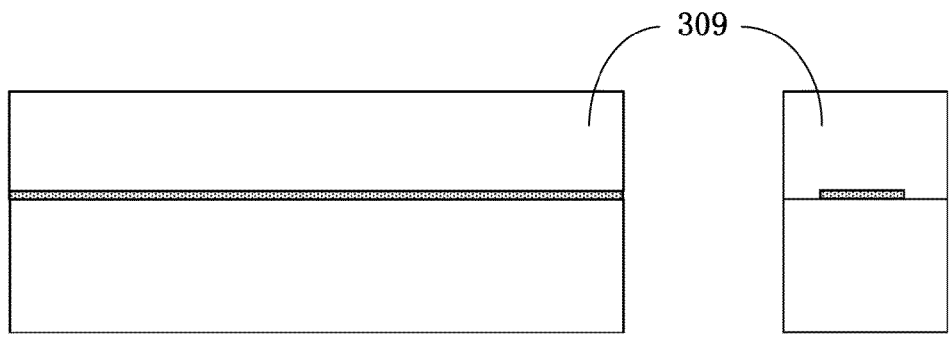

Thereafter, a second insulating layer 309 is formed to at least cover the patterned electrode layer, as illustrated in FIGS. 10(a)-10(b). FIG. 10(a) illustrates a front cross-sectional view of the device; FIG. 10(b) illustrates a side view of the device. The second insulating layer 309 can cover the patterned electrode layer as well as the first insulating layer 307.

Figure 11:
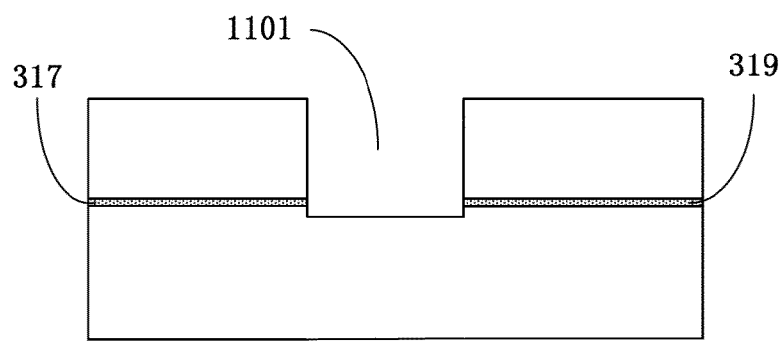

Next, an opening 1101 is formed penetrating through the second insulating layer and the electrode layer, as illustrated in FIG. 11. The opening 1101 can be formed by etching the second insulating layer 309 and the electrode layer 305. The opening 1101 is used for forming a phase-change material layer or island-shaped layer therein.

In one or more embodiments, the opening 1101 extends into the first insulating layer 307, as illustrated in FIG. 11. In one or more embodiments, the opening 1101 may not extend into the first insulating layer 307; nevertheless, the opening 1101 may still expose a cross-section of the electrode 317 and a cross-section of the electrode 319 to enable the electrodes to laterally contact the phase-change material island-shaped layer. The etching also defines the positions of the first electrode 317 and the second electrode 319. The step for forming the opening can be performed by multi-times of etching or performed in an all-in-one manner in a single etching apparatus.

In one or more embodiments, the patterned electrode layer 305 is used for forming both the first electrode 317 and the second electrode 319. In one or more embodiments, the first electrode and the second electrode should not be shorted. In one or more embodiments, the width b of the patterned electrode layer 305 is smaller than the size of the opening 1101 in the direction along the width of the patterned electrode layer (i.e. the width of the phase-change material island-shaped layer 313, which is to be formed later), such that the first electrode 317 and the second electrode 319 can be prevented from being shorted.

Figure 12:
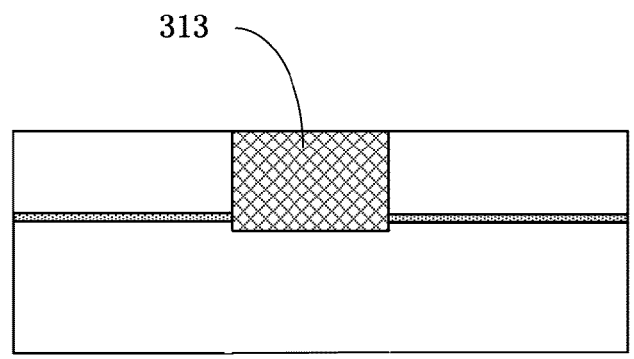

Thereafter, a phase-change material island-shaped layer 313 is formed in the opening 1101, as illustrated in FIG. 12. In one or more embodiments, the phase-change material can be GST (Ge—Sb—Te, germanium-antimony-tellurium). The first electrode 317 and the second electrode 319 (i.e., the remaining portions of the patterned electrode layer) laterally contact two opposite sides of the phase-change material island-shaped layer 313.

In one or more embodiments, the process for forming the phase-change material island-shaped layer 313 (or phase-change element 313) can comprise forming a phase-change material layer on the second insulating layer 309 and in the opening 1101, for example, by means of physical vapour deposition (PVD) or chemical vapour deposition (CVD), so as to fill up the opening. The process may further comprise performing chemical mechanical polishing (CMP) on the formed phase-change material layer such that the upper surface of the phase-change material layer is substantially flush with the upper surface of the second insulating layer 309, thereby forming the phase-change material island-shaped layer 313. In one or more embodiments, the phase-change material island-shaped layer may be formed by means of one or more of droplet discharging, printing (e.g. screen printing), etc.

Thereafter, in one or more embodiments, another insulating layer can be formed so as to cover the phase-change material island-shaped layer 313 and the second insulating layer.

FIGS. 8 and FIGS. 13(a)-18 illustrate a method of manufacturing a semiconductor memory device according to one or more embodiments of the present invention.

As illustrated in FIG. 8 and FIGS. 13(a)-13(c), after the formation of the electrode layer 305 on the insulating layer 307, the electrode layer 305 is patterned. FIG. 13(a) illustrates a front cross-sectional view of the device, FIG. 13(b) illustrates a side view of the device, and FIG. 13(c) illustrates a top view of the device. The patterning can appropriately define the shape, size, and/or position of the first electrode, for example, as illustrated in the FIG. 13(b) and FIG. 13(c), wherein the width b is specifically illustrated. The patterning defines the basic shape of the electrode. In one or more embodiments, the electrode has a bar shape or substantially rectangular shape. In one or more embodiments, the width b of the electrode layer is smaller than the size of the phase-change material island-shaped layer, which is to be formed later, in the direction along the width. In one or more embodiments, the electrode layer 305 is not used to form the second electrode.

Subsequently, the second insulating layer 309 is formed to at least cover the patterned electrode layer 305 and the first insulating layer 307, as illustrated in FIGS. 14(a)-14(b). FIG. 14(a) illustrates a front cross-sectional view of the device, and FIG. 14(b) illustrates a side view of the device.

Next, an opening 1501 is formed penetrating through the second insulating layer and the electrode layer, as illustrated in FIG. 15. For example, the opening 1501 can be formed by etching the second insulating layer 309 and the electrode layer 305. The opening 1501 is used for forming a phase-change material layer or island-shaped layer therein. In one or more embodiments, the opening 1501 extends into the first insulating layer 307, as illustrated in FIG. 8 and FIG. 15. In one or more embodiments, the opening 1501 may not extend into the first insulating layer 307; nevertheless, the opening 1501 may still expose a cross-section of the electrode 317 to enable the electrode 317 to laterally contact the phase-change material island-shaped layer. The etching also defines the position of the first electrode 317. The step of etching can be performed by multi-times of etching or performed in an all-in-one manner in one etching apparatus.

In one or more embodiments, the formation of the opening 1501 will have the electrode layer partially removed, thereby ensuring a good electrical contact.

Figure 16:
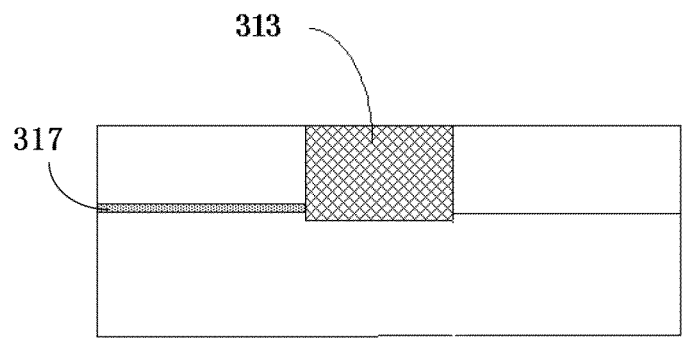
Figure 17:
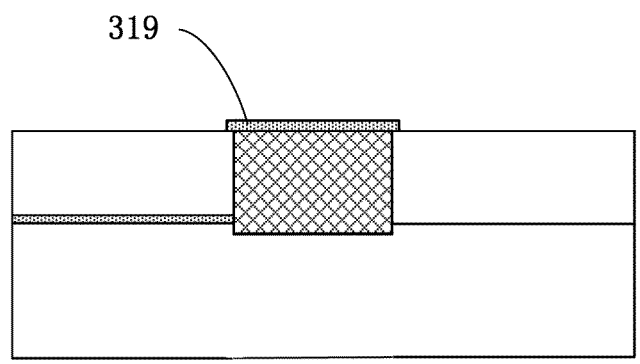

Subsequently, a phase-change material island-shaped layer 313 is formed in the opening 1501, as illustrated in FIG. 16. The first electrode 317 (i.e., the remaining portion of the patterned electrode layer) laterally contacts a side surface of the phase-change material island-shaped layer 313, while a bottom surface of the phase-change material island-shaped layer 313 contacts the insulating layer 307. Subsequently, a second electrode 319 is formed over the second insulating layer 309 and the phase-change material island-shaped layer 313, to substantially cover the upper surface of the phase-change material island-shaped layer 313, as illustrated in FIG. 17. The step of forming the second electrode may comprise forming an electrode layer over the second insulating layer 309 and the phase-change material island-shaped layer 313, for example, by sputtering or depositing. The step of forming the second electrode may further comprise patterning the electrode layer to form the second electrode 319.

Figure 18:
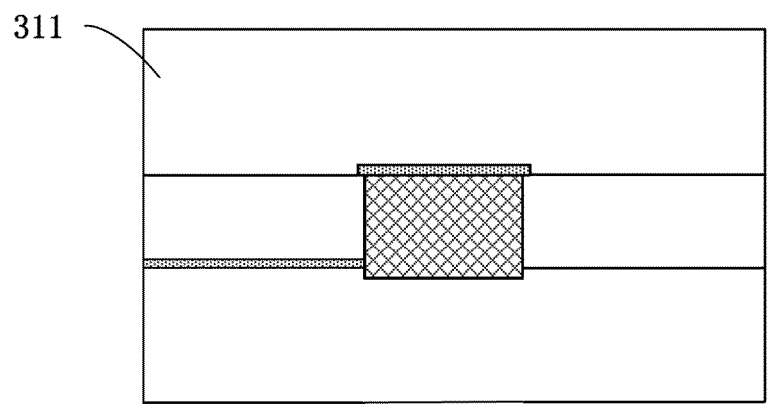
Figure 35:
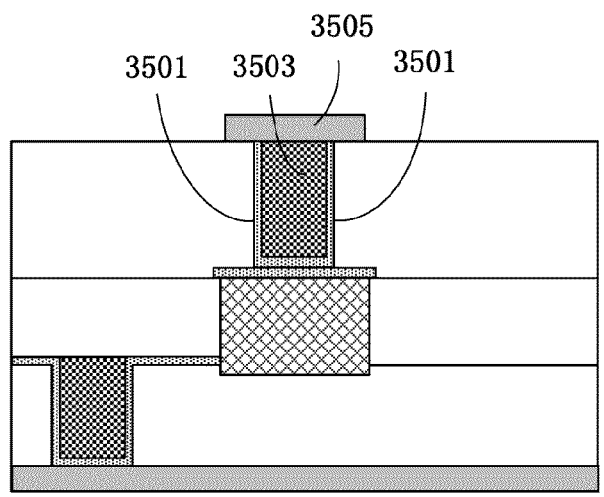
Figure 36:
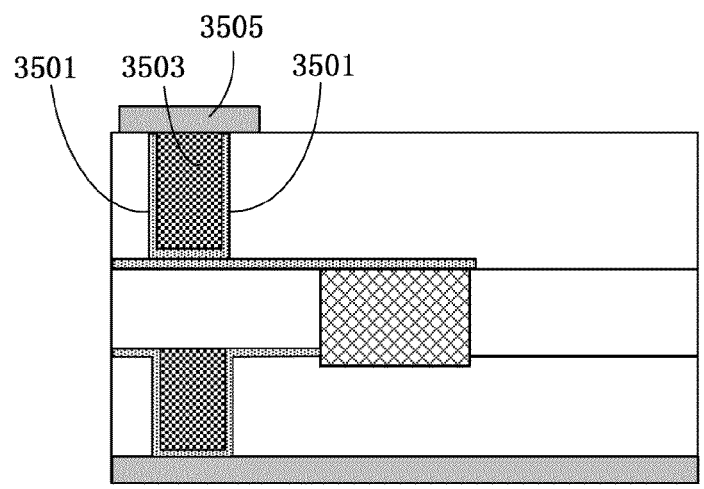

Subsequently, as illustrated in FIG. 18, a third insulating layer 311 is formed over the second insulating layer 309 and the second electrode 319. The third insulating layer 311 can be used to cover the second electrode 319, and a through-hole to the second electrode 319 can be formed therein (as illustrated in FIGS. 35 and 36).

FIG. 19 illustrates a process step corresponds to the structure illustrated in FIG. 3E, wherein the second electrode 319 covers the phase-change material island-shaped layer 313 and extends beyond the edge of the upper surface of the phase-change material island-shaped layer 313. In the subsequent processes, a via connected to the second electrode 319 will be formed over a portion of the second electrode 319, which extends beyond the edge of the upper surface of the phase-change material island-shaped layer 313, as illustrated in FIG. 36.

One skilled in the art would appreciate that the semiconductor memory device of the present disclosure can be implemented by alternative or additional methods, which also are within the scope of the present application. In one or more embodiments, for the structure illustrated in FIG. 3C, the following method can be employed:

Firstly, an electrode layer 305 is formed over a first insulating layer; subsequently, an opening is formed penetrating through the electrode layer and extending into the first insulating layer; subsequently, a phase-change material island-shaped layer is formed in the opening.

In one or more embodiments, a protective layer or a stop layer can be formed over the electrode layer such that the electrode layer can be protected when performing CMP on the phase-change material to form the phase-change material island-shaped layer, and/or the CMP can be stop at the stop layer and thus protect the electrode layer. Thereafter, the protective layer or the stop layer can be removed.

Hereunder, a manufacturing method of a semiconductor memory device according to one or more embodiments of the present disclosure will be described in conjunction with FIGS. 20-28.

In the method, a substrate (not explicitly illustrated) is provided. The substrate may include one or more of a semiconductor substrate, a sapphire substrate, a glass substrate, etc. On the substrate, a first insulating layer 2007 is formed and a conductive layer 2001 (for example, a metal layer or a metal wiring layer) underlying the first insulating layer 2007 is formed between the substrate and the insulating layer 2007.

In one or more embodiments, the conductive layer 2001 has enough strength to also serve as a substrate, and the aforementioned additional substrate may not be implemented.

In one or more embodiments, the conductive layer 2001 can be a metal layer or a metal wiring layer. In one or more embodiments, the conductive layer 2001 may include one or more of a doped active layer, a doped poly-silicon, etc. In one or more embodiments, the first insulating layer 2007 may cover the conductive layer 2001 and the layers below the conductive layer 2001 (such as a substrate or an insulating layer, if present).

In one or more embodiments, a through hole can be formed in the first insulating layer 2007 for forming a via (which can be called a first via or a lower via) therein.

Subsequently, an electrode layer 2005 is formed over the first insulating layer 2007, for example, by depositing (e.g. CVD or PECVD). Herein, where the first insulating layer 2007 has a through hole, the electrode layer 2005 also covers the bottom surface and the sidewalls of the through hole. In one or more embodiments, the electrode layer 2005 can be formed in the process of forming a via liner in a via formation process cycle using a liner material (e.g. TiN). Advantageously, several process steps can be saved and/or omitted, and the process for the device can be substantially simple. In one or more embodiments, the electrode layer can be formed of a suitable conductive material different from a liner material.

In one or more embodiments, the formed electrode layer 2005 is relatively thin in view of the width of the electrode layer 2005 and/or in view of a width of a typical phase-change element. In one or more embodiments, the electrode layer 2005 has a thickness a that may be substantially smaller than the width b of the electrode to be formed from the electrode layer 2005. For example, to the electrode layer 2005 may have a thickness of 20 nm.

Subsequently, a metal material layer 2008 is formed over the electrode layer. The metal material can comprise, for example, one or more of copper, aluminium, tungsten, nickel, etc. In one or more embodiments, the metal material may comprise an alloy of or a stack of two or more these (conductive) metals.

Next, as illustrated in FIG. 21, the metal material layer 2008 is subjected to etch-back or CMP. This etch-back or CMP may cause the upper surface of the electrode layer 2005 to be substantially exposed and/or may cause the upper surface of the remaining metal layer, i.e., a metal plug 2009, to be substantially flush with the upper surface of the electrode layer 2005. In one or more embodiments, this structure can be realized by causing the etch-back to stop (e.g. according to a trigger and/or according to timing) at the electrode layer 2005. FIG. 21(a) illustrates a front cross-sectional view of the device, and FIG. 12(b) illustrates a top view of the device, wherein the dotted circle indicates the edge of the via. Thus, a via (which is also referred to as a first via or a lower via) to the conductive layer 2001 is formed. The reference number 2009 in this figure indicates the metal plug in the via.

The device manufacturing method in one or more embodiments of the present invention may vary according to particular structures in the memory device. For example, in one or more embodiments, it may be unnecessary to form the lower via.

Next, as illustrated in FIGS. 22(b)-22(c), the electrode layer 2005 is patterned. FIG. 22 (a) illustrates a front cross-sectional view of the device; FIG. 22(b) illustrates a side view of the device, wherein the via is indicated by dotted lines; and FIG. 22(c) illustrates a top view of the device. The patterning defines the desired shape and size of the electrode(s) (in this embodiment, both of the first electrode and the second electrode), as illustrated in FIG. 22(b) and FIG. 22(c). In one or more embodiments, the electrode layer 2005 is patterned to have a bar shape (i.e., a rectangular shape in the top view or plan view of the device). In one or more embodiments, the width (b) of the electrode layer is smaller than the size of the phase-change material island-shaped layer to be formed later in a direction along the width.

Next, as illustrated in FIGS. 23(a) and 23(b), a second insulating layer 2301 is formed to cover the patterned electrode layer 2005, the metal material layer 2009, and the first insulating layer 2007. FIG. 23(a) is a front cross-sectional view of the device; and FIG. 23(b) is a side view of the device, wherein the via is indicated by dotted lines.

Next, as illustrated in FIG. 24, an opening 2401 is formed in the second insulating layer 2301. The opening 2401 penetrates through the electrode layer 2005. The opening 2401 is used for forming a phase-change material layer (which maybe island-shaped) therein. Although the opening 2401 is illustrated as extending into the first insulating layer 2007 in FIG. 24, it is not limited thereto, so long as the electrode layer (which is used for forming the first electrode and/or the second electrode) is exposed to laterally contact side surfaces of the phase-change material island-shaped layer. The etching step for forming the opening 2401 can be performed by etching of multi-times or can be performed in an all-in-one manner in one etching equipment.

In one or more embodiments, the patterned electrode layer 2005 is used for forming both the first electrode and the second electrode, such as those described in connection with FIGS. 3A-3B. In one or more embodiments, the width b of the patterned electrode layer 2005 is smaller than the size of the opening 2401 in a direction along the width of the patterned electrode layer (i.e. the size of the phase-change material island-shaped layer to be formed later in the direction along the width of the patterned electrode layer), such that the first electrode and the second electrode can be prevented from being shorted.

Figure 25:
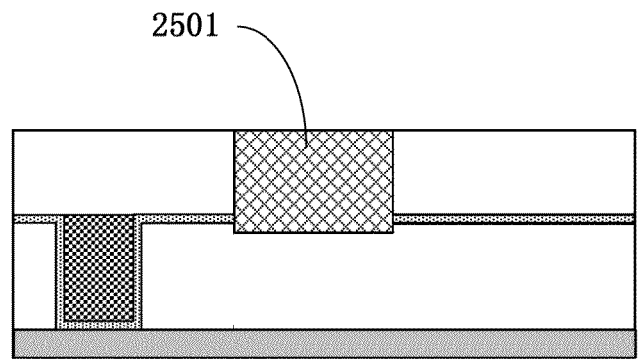

Next, as illustrated in FIG. 25, the phase-change material island-shaped layer 2501 is formed. This phase-change material can be GST or an alternative suitable material.

Figure 26:
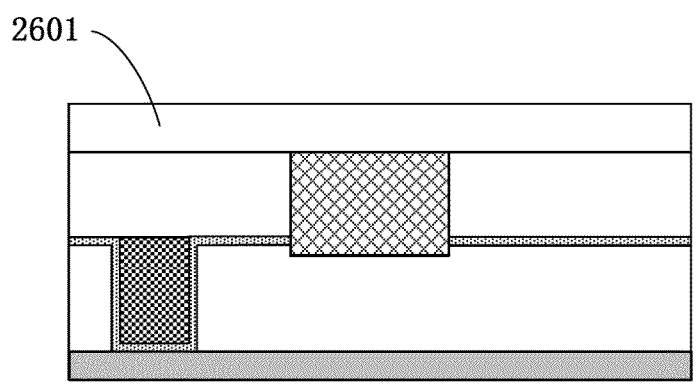

In one or more embodiments, as illustrated in FIG. 25, two exposed portions of the patterned electrode layer laterally contact two opposite sides of the phase-change material island-shaped layer; thus, a first electrode that laterally contacts a first side surface of the phase-change material and a second electrode that is opposite to the first electrode and laterally contacts a second side surface (opposite the first side surface) of the phase-change material are defined (formed). Thereafter, as illustrated in FIG. 26, insulating material is re-coated, that is, a third insulating layer 2601 is formed to cover the phase-change material island-shaped layer and the second insulating layer 2301.

Figure 27:
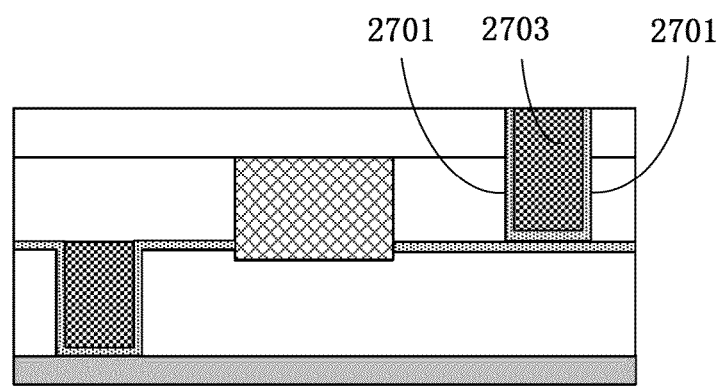

Next, as illustrated in FIG. 27, a via, which is also referred as a second via and an upper via, is formed penetrating through the second insulating layer 2301 and the third insulating layer 2601 and electrically connected to the second electrode. The upper via can comprise a liner 2701 and a metal plug 2703.

Next, as illustrated in FIG. 28, a wiring 2801 electrically connected to the via is formed.

In one or more embodiments, a solution of twice depositions can be employed for forming the lower via. During the process of forming a via in the first insulating layer 2007, after forming the metal material layer 2008 over the conductive layer 2005 (serving as the liner for the via) illustrated in FIG. 20, CMP is performed such that the metal plug 2009 and the liner 2003 in the hole are remained while portions of the metal material 2008 and of the conductive layer 2005 on the first insulating layer 2007 are removed, as illustrated in FIG. 37.

That is, a via penetrating through the first insulating layer and extending into the conductive layer 2001 is formed in the first insulating layer, wherein, the via comprises a liner 2003 and a metal plug 2009. More specifically, the via can be formed by: forming a through hole in the first insulating layer 2007 to extend into the underlying conductive layer 2001; depositing a liner material to cover the first insulating layer as well as the bottom surface and sidewalls of the through hole; forming a metal material layer over the liner material, for example, by sputtering or PVD; and performing a chemical mechanical polishing until the metal material layer and the liner over the first insulating layer are removed.

Thereafter, the electrode layer 3801 is deposited to cover the first insulating layer 2007 and the via, as illustrated in FIGS. 38(a)-38(b). For example, the electrode layer 3801 can be formed to have a thickness a. The electrode layer 3801 can be formed from a suitable conductive material or semiconductor material, and can be same as or different from the material for forming the liner 2003.

Subsequently, as illustrated in FIGS. 39(a)-39(c), a patterning processing similar to that illustrated in FIGS. 22(a)-22(c) is performed on the formed electrode layer 3801. Thereafter, processes similar to that illustrated in FIGS. 23(a)-28 can be carried out.

In one or more embodiments, for example, in structures where the second electrode and the first electrode are not formed from a same electrode layer (as illustrated in FIGS. 3D-3E), a wiring (which can serve as the second electrode) that contacts (the top surface of) the phase-change material island-shaped layer and/or a via to the second electrode can be formed in the third insulating layer.

FIGS. 29(a)-36 illustrate a method of manufacturing a semiconductor memory device according to one or more embodiments of the present invention.

As illustrated in FIGS. 21(a)-21(b) and FIGS. 29(a)-29(c), after performing etch-back or CMP on the metal material layer 2009, the electrode layer 2005 is patterned. FIG. 29(a) illustrates a front cross-sectional view of the device; the FIG. 29(b) illustrates a side view of the device, wherein, the via is indicated by dotted lines; and the FIG. 29(c) illustrates a top view of the device. The patterning defines the desired shape and size of the electrode (i.e., the first electrode), as illustrated in FIG. 29(b) and FIG. 29(c). In one or more embodiments of the present invention, the electrode is patterned to have a bar shape (i.e., a rectangular shape in the top view of the device). In one or more embodiments, the width b of the electrode is smaller than the size of the phase-change material island-shaped layer to be formed later in a direction along the width. In one or more embodiments, the electrode layer 2005 is not used to form a second electrode.

Next, as illustrated in FIGS. 30(a)-30(b), a second insulating layer 2301 is formed over the remaining portion of the patterned electrode layer 2005 and the metal plug 2009. FIG. 30(a) illustrates a front cross-sectional view of the device; and FIG. 30(b) illustrates a side view of the device, wherein the via is indicated by dotted lines.

Figure 31:
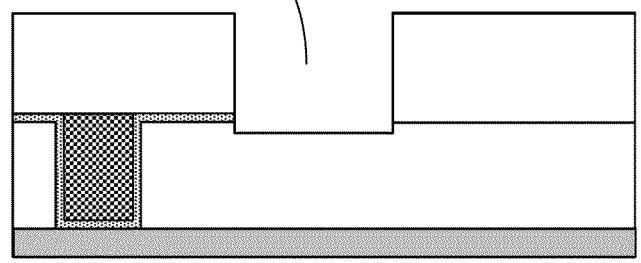

Next, as illustrated in FIG. 31, an opening 2401 is formed in the second insulating layer 2301, and the opening 2401 penetrates through the electrode layer 2005. The opening 2401 is used for forming a phase-change material layer (which may be island-shaped) therein. Although the opening 2401 is illustrated as extending into the first insulating layer 2007 in FIG. 31, it is not necessarily so, as long as the electrode layer is exposed to laterally contact a side surface of the phase-change material island-shaped layer. The etching step for forming the opening 2401 can be performed by etching of multi-times or can be performed in an all-in-one manner in one etching equipment.

In one or more embodiments, the width b of the patterned electrode is smaller than the size of the opening 2401 in a direction along the width of the patterned electrode layer (i.e. the size of the phase-change material to be formed later in the direction along the width of the patterned electrode layer).

Figure 32:
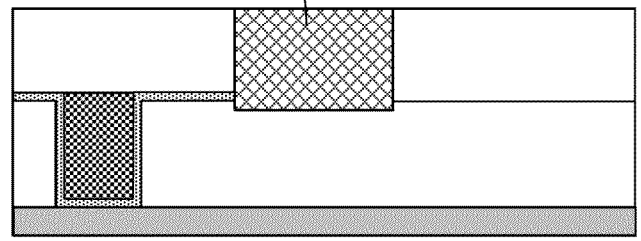

Next, as illustrated in FIG. 32, the phase-change material island-shaped layer 2501 is formed. The phase-change material can be GST or an alternative suitable material. As illustrated in FIG. 32, the patterned electrode (the first electrode) laterally contacts a side surface of the phase-change material island-shaped layer.

Figure 33:
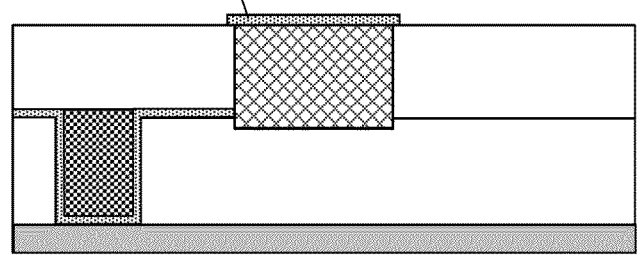

Thereafter, as illustrated in FIG. 33, a second electrode 3301 is formed to substantially cover the upper surface of the phase-change material island-shaped layer 2501.

Figure 34:
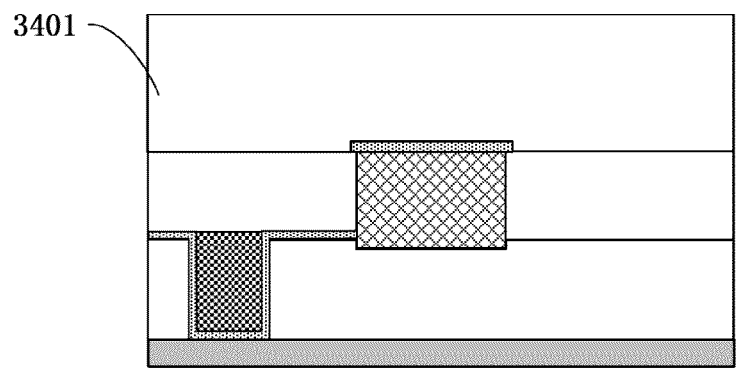

Next, as illustrated in FIG. 34, insulating material is re-coated to form a third insulating layer 3401, so as to cover the second electrode 3301 and the second insulating layer 2301.

Subsequently, an upper via electrically connected to the second electrode and a wiring 3505 connected to the upper via are formed, as illustrated in FIG. 35. The upper via comprises a liner 3501 and a metal plug 3503.

FIG. 36 illustrates a structure in accordance with one or more embodiments of the invention. As illustrated FIG. 36, the second electrode 3301 covers the upper surface of the phase-change material island-shaped layer 2501 and extends beyond the edge of the upper surface of the phase-change material island-shaped layer 2501. In subsequent processes, a via (which comprises the liner 3501 and the metal plug 3503) is formed over the portion of the second electrode 3301 that extends beyond the edge of the upper surface of the phase-change material island-shaped layer 2501. Thereafter, a wiring 3505 connected to this via can be formed. In one or more embodiments, the upper via maybe substantially aligned with the lower via in a direction perpendicular to the upper surface of the second electrode.

Figure 40:
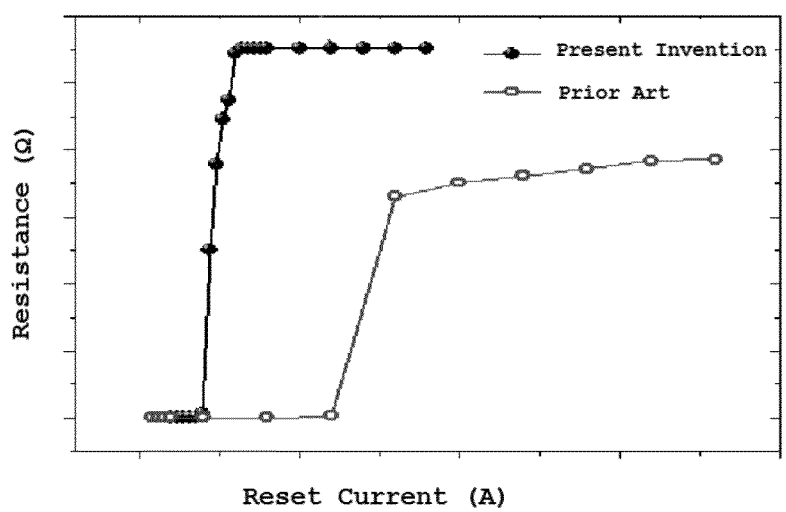
FIG. 40 illustrates performance improvement of one or more embodiments of the present invention over a conventional device.

FIG. 40 schematically illustrates the performance improvement of one or more embodiments of the present invention over a conventional (prior art) device according to simulation results. It can be seen from FIG. 40 that a device (such as aPCRAM)according to one or more embodiments of the present invention has a lower drive current (or rest current) and/or a higher resistance difference between two states where the device stores "0" and "1", respectively.

It should be understood that, according to different implementations, the manufacturing method of a semiconductor memory device according to embodiments of the present invention can be varied correspondingly. One skilled in the art can readily know how to implement the corresponding methods based on the teachings of the present disclosure and within the scope of the present disclosure. In the disclosure, the boundaries between steps are merely illustrative, and those steps commonly known or auxiliary steps, such as cleaning, drying, etc., are omitted and can be implemented according to knowledge in the art. One skilled in the art should appreciate that some steps described herein can be divided into several steps, or some steps can be combined into one step. For example, some etching steps can be performed through multi-times of etching or can be performed in an all-in-one manner in one etching equipment.

Although some manufacturing methods of semiconductor memory devices, such as PCRAM devices, according to one or more embodiments of the present disclosure have been illustrated, one skilled in the art can readily modify or vary these methods such that they can be suitably applied to other embodiments, based on the teachings of the disclosure.

Although some specific embodiments of the present disclosure have been described in connection with the drawings, it should be appreciated that the above embodiments are only intended to be illustrative but not to limit the scope of the present disclosure. It should also be appreciated that these embodiments can be combined with each other without departing from the scope of the present disclosure. Further, the above embodiments can be modified by those skilled in the art without departing from the scope and spirit of the present disclosure. All these modifications and variations are embraced within the scope of the present disclosure as defined by the claims as follows.

What is claimed is:

1. A semiconductor memory device, comprising:
a first insulating portion;
a phase-change material element that directly contacts the first insulating portion;
a first electrode, which directly contacts a first side surface of the phase-change material element, the first side surface of the phase-change material element being not parallel to a top surface of the first electrode;
an insulating layer, wherein a planar surface of the insulating layer directly contacts a planar surface of the phase-change material element, and wherein the planar surface of the phase-change material element is not parallel to the first side surface of the phase-change material element; and
a second insulating portion surrounding the phase-change material element, directly contacting each of the planar surface of the insulating layer, the first side surface of the phase-change material element, and the first insulating portion, and being asymmetric with reference to the phase-change material element.

2. The semiconductor memory device of claim 1, wherein the phase-change material element extends into the first insulating portion.

3. The semiconductor memory device of claim 1, wherein the first electrode is narrower than the phase-change material element in a direction parallel to the first side surface of the phase-change material element.

4. The semiconductor memory device of claim 1, wherein a thickness of the first electrode is smaller than a width of the first electrode.

5. The semiconductor memory device of claim 1, further comprising:
a first via comprising a liner and a metal plug disposed between two portions of the liner,
wherein the first electrode and the liner are directly connected to each other, and wherein a material of the first electrode is identical to a material of the liner.

6. The semiconductor memory device of claim 1, further comprising a second electrode contacting a second side surface of the phase-change material element.

7. The semiconductor memory device of claim 6, further comprising a via that comprises a liner, wherein a material of the first electrode is identical to each of a material of the second electrode and a material of the liner, and wherein the second electrode is directly connected to the liner.

8. The semiconductor memory device of claim 1, wherein the planar surface of the insulating layer is larger than the planar surface of the phase-change material element.

9. The semiconductor device of claim 1, wherein part of the second insulating portion directly contacts the first insulating portion and is disposed between the first electrode and the first insulating portion in a direction perpendicular to the planar surface of the phase-change material element.

10. A semiconductor memory device comprising:
a first insulating portion;
a first electrode, which overlaps and directly contacts the first insulating portion;
a second insulating portion;
a phase-change material element, which directly contacts the second insulating portion and directly contacts the first electrode,
wherein the first electrode contacts a first side surface of the phase-change material element,
wherein the first side surface of the phase-change material element is not parallel to a top surface of the first electrode, and
wherein a bottom surface of the phase-change material element is at an angle with respect to the first side surface of the phase-change material element, is disposed between a top surface of the phase-change material element and a surface of the first insulating portion, is parallel to the surface of the first insulating portion, and contacts the surface of the first insulating portion.

11. The semiconductor memory device of claim 10, wherein the phase-change material element extends into the first insulating portion.

12. The semiconductor memory device of claim 10, wherein a thickness of the first electrode is smaller than a width of the first electrode.

13. The semiconductor memory device of claim 10, further comprising:
a first via comprising a liner and a metal plug disposed between two portions of the liner,
wherein the first electrode and the liner are formed from a continuous layer of a same material.

14. The semiconductor memory device of claim 10, further comprising a second electrode, which contacts a second side surface of the phase-change material element.

15. The semiconductor memory device of claim 14, wherein the first electrode, the second electrodes, and a liner of a via are formed from a continuous layer of a same material.

16. The semiconductor memory device of claim 10, further comprising a second electrode, which contacts a top surface of the phase-change material element.

17. The semiconductor device of claim 10, wherein part of the second insulating portion is disposed between the first electrode and the first insulating portion.

18. A semiconductor memory device comprising:
a first insulating portion;
a first electrode, which overlaps the first insulating portion;
a second insulating portion;
a phase-change material element, which directly contacts the second insulating portion and directly contacts the first electrode,
wherein the first electrode contacts a first side surface of the phase-change material element,
wherein the first side surface of the phase-change material element is not parallel to a top surface of the first electrode,
wherein a bottom surface of the phase-change material element is at an angle with respect to the first side surface of the phase-change material element, is disposed between a top surface of the phase-change material element and a surface of the first insulating portion, and contacts the surface of the first insulating portion, and
wherein the first electrode is narrower than the phase-change material element in a direction parallel to both the first side surface of the phase-change material element and the bottom surface of the phase-change material element.

19. The semiconductor memory device of claim 18, wherein a thickness of the first electrode is smaller than a width of the first electrode.

20. The semiconductor memory device of claim 18, further comprising:
a first via comprising a liner and a metal plug disposed between two portions of the liner,
wherein the liner directly contacts the first insulating portion and is directly connected to the first electrode.

* * * * *